US012603632B2

(12) United States Patent (10) Patent No.: US 12,603,632 B2

Meister et al. (45) Date of Patent: Apr. 14, 2026

(54) BULK ACOUSTIC WAVE DEVICES HAVING ELECTRODES WITH ACOUSTIC IMPEDANCE GRADIENTS TO IMPROVE COUPLING EFFICIENCY AND RELATED FABRICATION METHODS

(71) Applicant: RF360 Singapore Pte. Ltd., Singapore (SG)

(72) Inventors: Veit Meister, Unterhaching (DE); Maximilian Schiek, Puchheim (DE); Juha Sakari Ella, Turku (FI); Edgar Schmidhammer, Stein an der Traun (DE); Christian Ceranski, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 274 days.

(21) Appl. No.: 18/468,847

(22) Filed: Sep. 18, 2023

(65) Prior Publication Data

US 2025/0096766 A1 Mar. 20, 2025

(51) Int. Cl.
H03H 9/02 (2006.01)
H03H 3/02 (2006.01)
H03H 9/13 (2006.01)
H03H 9/54 (2006.01)

(52) U.S. Cl.
CPC .......... H03H 9/02015 (2013.01); H03H 3/02 (2013.01); H03H 9/133 (2013.01); H03H 9/54 (2013.01)

(58) Field of Classification Search
CPC ....... H03H 9/02015; H03H 9/133; H03H 9/54
See application file for complete search history.

(56) References Cited

U.S. PATENT DOCUMENTS

| | | |
|---|---|---|
| 2006/0164186 A1 | 7/2006 | Stoemmer et al. |
| 2009/0267457 A1 | 10/2009 | Barber et al. |
| 2009/0309677 A1 | 12/2009 | Schmidhammer |
| 2014/0125203 A1 | 5/2014 | Choy et al. |
| 2015/0280100 A1 | 10/2015 | Burak et al. |
| 2015/0349743 A1 | 12/2015 | Burak et al. |
| 2016/0365842 A1 | 12/2016 | Marksteiner |
| 2017/0310303 A1 | 10/2017 | Thalhammer et al. |

(Continued)

FOREIGN PATENT DOCUMENTS

WO        2021077717 A1      4/2021

OTHER PUBLICATIONS

U.S. Appl. No. 17/933,564, filed Sep. 20, 2022.

(Continued)

*Primary Examiner* — Samuel S Outten
(74) *Attorney, Agent, or Firm* — W&T

(57) ABSTRACT

BAW devices include a piezoelectric layer with a first electrode layer on one face and a second electrode layer on the opposite face. The piezoelectric layer and electrode layers determine a coupling efficiency of the BAW devices, which is a measure of the acoustic response of the piezo-electric layer to an input signal. In a BAW device, a first side of the first electrode layer comprises a first material adjacent to a first face of the piezoelectric layer, and a second side of the first electrode layer, opposite to the first face of the piezoelectric layer, comprises a second material, where the first material and the second material have different acoustic impedances. An electrode layer with an acoustic impedance gradient increases the coupling efficiency of the BAW devices.

25 Claims, 13 Drawing Sheets

(56)  References Cited

U.S. PATENT DOCUMENTS

| | | |
|---|---|---|
| 2019/0326873 A1 | 10/2019 | Bradley et al. |
| 2022/0123719 A1 | 4/2022 | Burak et al. |
| 2024/0097642 A1 | 3/2024 | Ella et al. |
| 2025/0253824 A1 | 8/2025 | Ella et al. |

OTHER PUBLICATIONS

Mrayl, Z.L., "Acoustic Properties of Solids," Onda Corporation, updated Apr. 11, 2003, online Jan. 31, 2012: <URL: https://web.archive.org/web/20120131143033if_/http://www.ondacorp.com/images/Solids .pdf>, 7 pages.
Zimmermann, G. et al., "Materials with an Acoustic Impedance Gradient," Materials Science Forum, vols. 308-311, May 1999, Trans Tech Publications, Switzerland, pp. 533-538.
International Search Report and Written Opinion for International Patent Application No. PCT/SG2024/050528, mailed Dec. 16, 2024, 16 pages.

500

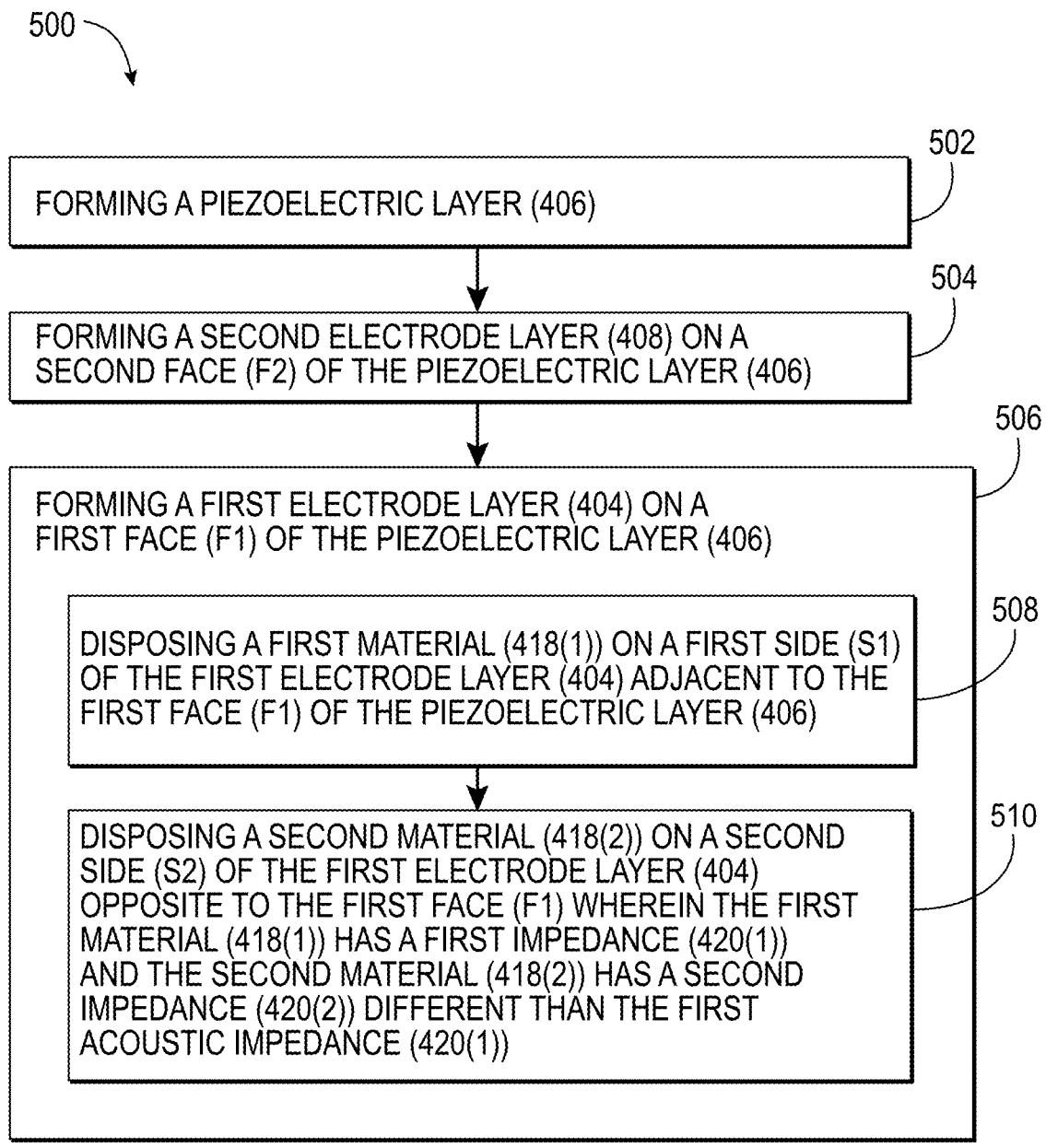

502

FORMING A PIEZOELECTRIC LAYER (406)

504

FORMING A SECOND ELECTRODE LAYER (408) ON A
SECOND FACE (F2) OF THE PIEZOELECTRIC LAYER (406)

506

FORMING A FIRST ELECTRODE LAYER (404) ON A
FIRST FACE (F1) OF THE PIEZOELECTRIC LAYER (406)

508

DISPOSING A FIRST MATERIAL (418(1)) ON A FIRST SIDE (S1)
OF THE FIRST ELECTRODE LAYER (404) ADJACENT TO THE
FIRST FACE (F1) OF THE PIEZOELECTRIC LAYER (406)

510

DISPOSING A SECOND MATERIAL (418(2)) ON A SECOND
SIDE (S2) OF THE FIRST ELECTRODE LAYER (404)
OPPOSITE TO THE FIRST FACE (F1) WHEREIN THE FIRST
MATERIAL (418(1)) HAS A FIRST IMPEDANCE (420(1))
AND THE SECOND MATERIAL (418(2)) HAS A SECOND
IMPEDANCE (420(2)) DIFFERENT THAN THE FIRST
ACOUSTIC IMPEDANCE (420(1))

FIG. 5

BULK ACOUSTIC WAVE DEVICES HAVING ELECTRODES WITH ACOUSTIC IMPEDANCE GRADIENTS TO IMPROVE COUPLING EFFICIENCY AND RELATED FABRICATION METHODS

BACKGROUND

I. Field of the Disclosure

The technology of the disclosure relates generally to micro-acoustic devices and, more particularly, to bulk acoustic wave (BAW) devices employed in acoustic resonators.

II. Background

Wireless devices, such as cellular telephones, communicate by transmitting and receiving electromagnetic waves through the air. Cellular telephones are allowed to operate within certain ranges of radio frequencies. The frequencies available for operation vary with geographical region (e.g., country) and are limited to certain frequency bands or ranges. Those frequencies may be sandwiched between other frequency bands (e.g., above and below) allocated to other applications, which can cause some interference or overlap. For at least this reason, cellular telephones need to include frequency filters that allow certain frequencies to be received while others are blocked. The frequencies transmitted and received by a wireless device can be filtered by micro-acoustic devices employed within transceivers in handheld devices.

One example of a micro-acoustic device is known as a bulk acoustic wave (BAW) filter based on BAW resonators. BAW resonators have at least one layer of piezoelectric material sandwiched between two electrode layers. The BAW resonator receives an electrical signal that produces a varying electric field between the electrode layers. The piezoelectric layer will expand and contract in response to the varying electric field to produce acoustic waves with a resonant frequency that depends on the physical characteristics of the BAW device, such as the thickness of the piezoelectric layers and the electrode layers. However, with each new technology generation (e.g., 4G, 5G, 6G etc.), higher frequencies are being transmitted, which corresponds to a need for thinner piezoelectric layers and electrode layers. Additionally, there are multiple reasons for continuing to improve the efficiency of BAW devices.

SUMMARY

Aspects disclosed in the detailed description include bulk acoustic wave (BAW) devices having electrodes with acoustic impedance gradients to improve coupling efficiency. Methods of fabricating BAW devices including electrodes with acoustic impedance gradients are also disclosed. BAW devices include a piezoelectric layer with a first electrode layer on one face and a second electrode layer on the opposite face. Together with the piezoelectric layer, the electrode layers determine resonant frequencies of the BAW devices and also influence the coupling efficiency, which is a measure of the acoustic response of the piezoelectric layer to an input signal. In an exemplary BAW device disclosed herein, a first side of the first electrode layer comprises a first material adjacent to a first face of the piezoelectric layer, and a second side of the first electrode layer, opposite to the first face of the piezoelectric layer, comprises a second material, where the first material and the second material have different acoustic impedances. An electrode layer with an acoustic impedance gradient increases the coupling efficiency of the BAW device. In some examples, such as full wave BAW devices, the acoustic impedance increases in the material of the electrode layer farther from the piezoelectric layer. In other examples, such as half-wave BAW devices, the acoustic impedance decreases in the material of the electrode layer farther from the piezoelectric layer.

In an exemplary aspect, a BAW device is disclosed. The BAW device includes a piezoelectric layer, a first electrode layer on a first face of the piezoelectric layer and a second electrode layer on a second face of the piezoelectric layer. The first electrode layer comprises a first side comprising a first material adjacent to the first face of the piezoelectric layer and a second side comprising a second material opposite to the first face of the piezoelectric layer. The first material comprises a first acoustic impedance and the second material comprises a second acoustic impedance different than the first acoustic impedance.

In another exemplary aspect, a method of making a BAW device is disclosed. The method includes forming a piezoelectric layer, forming a second electrode layer on a second face of the piezoelectric layer, and forming a first electrode layer on a first face of the piezoelectric layer. The first electrode layer comprises a first material on a first side of the first electrode layer adjacent to the first face of the piezoelectric layer and a second material on a second side of the first electrode layer opposite to the first face of the piezoelectric layer. The first material comprises a first acoustic impedance and the second material comprises a second acoustic impedance different than the first acoustic impedance.

In a further exemplary aspect, an acoustic filter is disclosed. The acoustic filter includes a BAW device. The BAW device includes a piezoelectric layer, a first electrode layer on a first face of the piezoelectric layer, and a second electrode layer on a second face of the piezoelectric layer. The first electrode layer comprises a first side comprising a first material adjacent to the first face of the piezoelectric layer and a second side comprising a second material opposite to the first face of the piezoelectric layer. The first material comprises a first acoustic impedance and the second material comprises a second acoustic impedance different than the first acoustic impedance.

BRIEF DESCRIPTION OF THE DRAWINGS

FIG. 5 is a flow chart of a method of manufacturing an exemplary BAW device including an electrode with increasing acoustic impedance to improve coupling efficiency, as shown in FIGS. 4A and 4B;

DETAILED DESCRIPTION

Figures 1, 2:
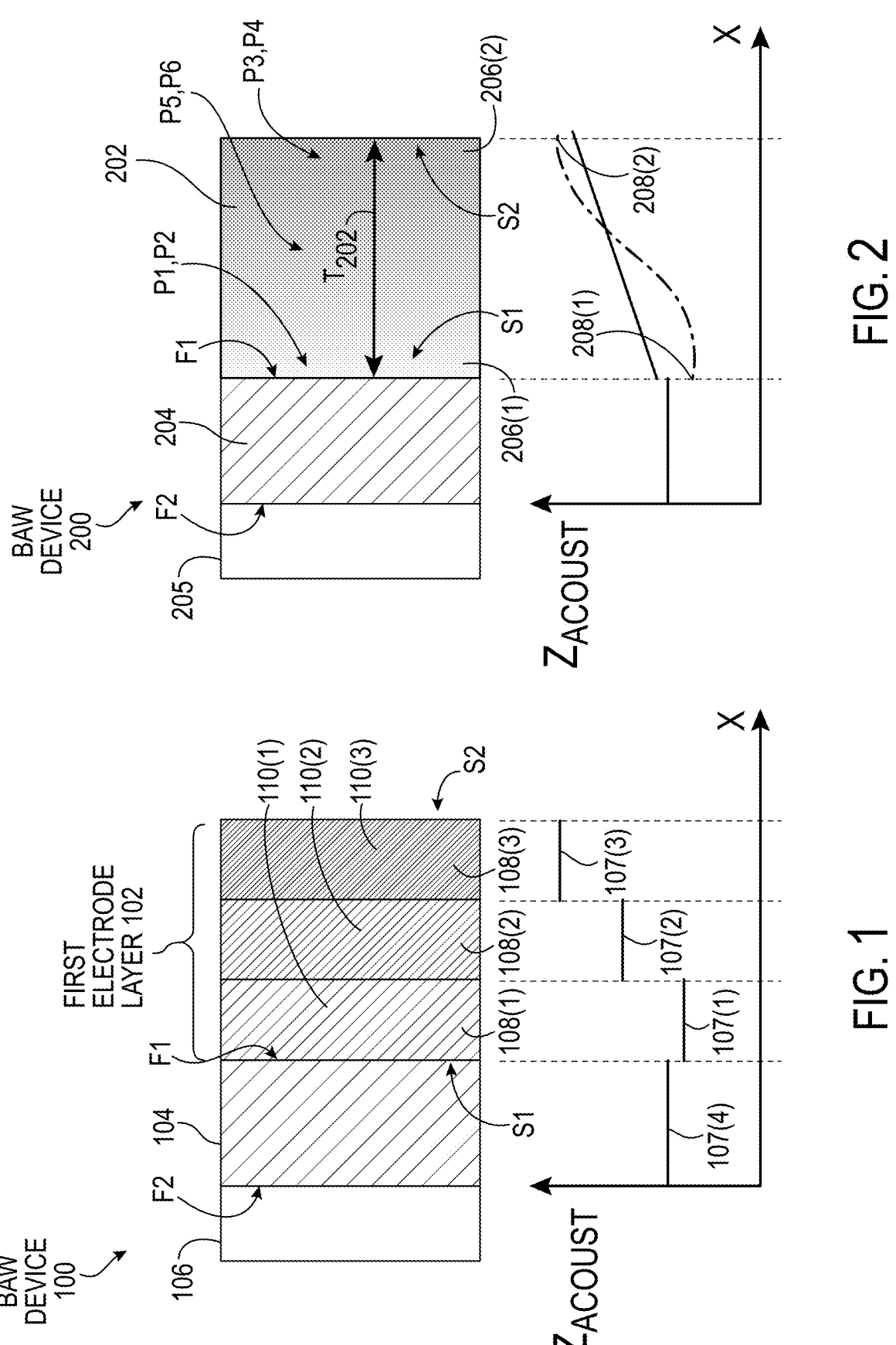
FIGS. 1 and 2 each include a cross-sectional side view of examples of a bulk acoustic wave (BAW) device including an electrode layer disposed on a piezoelectric layer, and a graph illustrating acoustic impedances of the electrode layer to improve coupling efficiency.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include bulk acoustic wave (BAW) devices having electrodes with acoustic impedance gradients to improve coupling efficiency. Methods of fabricating BAW devices including electrodes with acoustic impedance gradients are also disclosed. BAW devices include a piezoelectric layer with a first electrode layer on one face and a second electrode layer on the opposite face. Together with the piezoelectric layer, the electrode layers determine the resonant frequencies of the BAW device and also influence the coupling efficiency, which is a measure of the acoustic response of the piezoelectric layer to an input signal. In an exemplary BAW device disclosed herein, a first side of the first electrode layer comprises a first material adjacent to the first face of the piezoelectric layer, and a second side of the first electrode layer, opposite to the first face, comprises a second material, where the first material and the second material have different acoustic impedances. A first electrode layer with an acoustic impedance gradient increases the coupling efficiency of the BAW device. In some examples, such as full wave BAW devices, the acoustic impedance increases in the first electrode layer farther from the piezoelectric layer. In other examples, such as half-wave BAW devices, the acoustic impedance decreases in material farther away from the piezoelectric layer.

FIG. 1 includes a cross-sectional side view of a first example of an exemplary BAW device 100 including a first electrode layer 102 having an acoustic impedance gradient that improves coupling efficiency. The first electrode layer 102 is disposed on a first face F1 of a piezoelectric layer 104 and a second electrode layer 106 is disposed on a second face F2 of the piezoelectric layer 104. FIG. 1 also includes a graphical representation of acoustic impedance indicated on the axis $Z_{ACOUST}$ for all layers of the BAW device 100 to show the respective acoustic impedances 107(1), 107(2), and 107(3) of materials 108(1)-108(3), which are the materials of sub-layers 110(1)-110(3), respectively, of the first electrode layer 102. The piezoelectric layer 104 may comprise aluminum scandium nitride (AlScN), for example, or another suitable piezoelectric material. An acoustic impedance 107(4) of the piezoelectric layer 104 is also shown, as an example.

The sub-layers 110(1), 110(2), and 110(3) are layers of the materials 108(1), 108(2), and 108(3), respectively, not shown to scale. Sub-layer 110(1) is on a first side S1 of the first electrode layer 102 adjacent to the first face F1 of the piezoelectric layer. The material 108(1) of the sub-layer 110(1) may be disposed directly on (e.g., in direct contact with) the face F1 of the piezoelectric layer 104, or there may be an intervening layer (not shown). The sub-layer 110(3) is on a second side S2 of the first electrode layer 102 opposite to the first face F1 of the piezoelectric layer 104. The sub-layer 110(2) is between the sub-layer 110(1) and the sub-layer 110(3). The sub-layer 110(2) may be in direct contact with the sub-layers 110(1) and 110(3), or there may be intervening layers.

The material 108(1) of the sub-layer 110(1) in this example is selected so that the acoustic impedance 107(1) is not significantly different than the acoustic impedance AI4 (107(4)) of the piezoelectric layer 104. However, the acoustic impedance 107(2) of the material 108(2) of the sub-layer 110(2) is greater than the acoustic impedance 107(1) of the material 108(1) of the sub-layer 110(1) and the acoustic impedance 107(3) of the material 108(3) of the sub-layer 110(3) is greater than the acoustic impedance 107(2) of the material 108(2) of the sub-layer 110(2). Thus, there is a gradient of acoustic impedance in the first electrode layer 102 that avoids a sudden transition from the piezoelectric layer 104 to the first electrode layer 102, and then increases in the direction extending away from the first face F1 of the piezoelectric layer 104. It has been found that, in some examples of BAW devices comprising at least one electrode layer with a gradient of acoustic impedance increasing in the first direction (X-axis in FIG. 1), like the first electrode layer 102, the coupling efficiency ($k^2$) of the BAW device is higher than in comparable BAW devices not having a such an electrode layer.

Although referred to as a "gradient" above, the acoustic impedance of the first electrode layer 102 increases in steps. That is, rather than the acoustic impedance increasing continuously with a corresponding change in the X-axis direction from the first side S1 to the second side S2, the acoustic impedance has discontinuous or abrupt changes, which is an increase in this example (e.g., in steps or increments) from acoustic impedance 107(1), to 107(2), and 107(3) with a change in the X-axis direction, because the sub-layers 110(1)-110(3) comprise different materials 108(1), 108(2), and 108(3), respectively. For example, each of the materials 108(1), 108(2), and 108(3) may be conductive materials, such as metals, that are each different from the others and have different acoustic impedances.

For example, the material 108(1) of sub-layer 110(1) may be a layer of a first metal (e.g., titanium (Ti), which has an acoustic impedance of twenty-seven point three (27.3) Pascal-seconds per cubic meter (Pa-s/m³)). As an example, the sub-layer 110(1) may have a thickness of approximately eighty nanometers (80 nm). The material 108(3) of sub-layer 110(3) comprises a second metal different than the first metal (e.g., molybdenum (Mo) having an acoustic impedance of sixty-three point one (63.1) Pa-s/m³)). The material 108(2) of the sub-layer 110(2) comprises a third metal different than the first metal and the second metal (e.g., hafnium (Hf) having an acoustic impedance of forty (40) Pa-s/m³). The examples of the materials 108(1)-108(3) provided herein are not limited. Rather, the materials 108(1)-108(3) may be other metals or any appropriate conductive material(s).

The sub-layer 110(3) may have a thickness T3 of approximately eighty (80) nm, and the sub-layer 110(2) may have a thickness T2 of approximately fifty (50) nm. In this example, the sub-layer 110(1) does not include the second material 108(2) or the third material 108(3), the sub-layer 110(2) does not include the first material 108(1) or the third material 108(3), and sub-layer 110(3) does not include the first material 108(1) or the second material 108(2). Thus, the sub-layers 110(1)-110(3) may be referred to as uniform layers or monolithic layers because each layer has a uniform composition and properties within the layer. In other examples, each of the sub-layers 110(1)-110(3) may be any combination of materials to achieve a desired acoustic impedance gradient. The third material 108(2) is between the first material 108(1) and the second material 108(3) and may be in contact with the first material 108(1) and the second material 108(3).

In contrast to the incremental step increases of acoustic impedance from 107(1) to 107(2) to 107(3) in the first electrode layer 102 in FIG. 1, due to the different materials 108(1), 108(2), and 108(3), a second example of a BAW device 200 in FIG. 2 includes a first electrode layer 202 with a more gradual gradient of acoustic impedance disposed on first face F1 and a second electrode layer 205 disposed on a second face F2 of the piezoelectric layer 204. The acoustic impedance of the first electrode layer 102 changes continuously in the X-axis direction in a direction orthogonal to the first face F1. Whereas the gradient of acoustic impedance in the first electrode layer 102 is referred to as incremental steps or discontinuous, the gradient of acoustic impedance of the first electrode layer 202 is referred to as gradual or continuous. As shown in the graphical representation of the acoustic impedance $Z_{ACOUST}$ corresponding to the cross-sectional side view in FIG. 2, the acoustic impedance of the first electrode layer 202 gradually increases in a direction away from the face F1 of a piezoelectric layer 204 from a first acoustic impedance 208(1) to a second, higher acoustic impedance 208(2), which contrasts to the acoustic impedances 107(1)-107(3) in FIG. 1, which remain constant for some distance in the X-axis direction and then incrementally change in a short distance (e.g., from 107(1) to 107(2) or from 107(2) to 107(3)). In a gradual gradient, changes in distance away from the first face F1 of the piezoelectric layer 204 correspond to changes in acoustic impedance of the first electrode layer 202. Such changes are more uniform in the first electrode layer 202 than the step changes in the acoustic impedance in the first electrode layer 102 in FIG. 1. Stated differently, a rate of change of acoustic impedance 208(1) of the first electrode layer 202 on a first side S1 to a second acoustic impedance 208(2) on a second side S2 of the first electrode layer 202 may be constant or nearly constant compared to the rate of change from acoustic impedance 107(1) to 107(2) to 107(3) occurring in steps in the first electrode layer 102 due to the different materials 108(1), 108(2), 108(3).

A gradual rate of change in acoustic impedance may be achieved by a smoother transition in the composition of the materials of the first electrode layer 202 in FIG. 2 from first side S1 to the second side S2 compared to that of the first electrode layer 102 in FIG. 1. The first electrode layer 202 in FIG. 2 may transition from materials on the first side S1 to materials on the second side S2. For example, materials may be deposited by sputtering or evaporation of electrode materials in controlled percentages. For example, the first material 206(1) deposited on or adjacent to the first face F1 of the piezoelectric layer 204 may include a first percentage P1 of a first conductive material (e.g., metal) and a second percentage P2 of a second conductive material. As an example, the first percentage P1 of the first conductive material may be in a range of 100%-95% in the first material 206(1) with the corresponding second percentage P2 of the second conductive material in a range of zero to five percent (0%-5%), for example.

The percentages P1 and P2 may be changed (e.g., linearly) at a desired rate during deposition such that when the first electrode layer 202 reaches a desired thickness T202, the second material 206(2) has a lower percentage of the first metal and a higher percentage of the second metal. For example, at the second side S2, the second material 206(2) may comprise the first conductive material at a third percentage P3 in a range of 5%-0% and the second conductive material at a fourth percentage P4 in a range of ninety-five to one hundred percent (95%-100%). It should be understood that the first electrode layer 202 is not limited to the percentages above. Conductive materials may be selected to provide the desired gradient of acoustic impedance from the first side S1 to the second side S2 of the first electrode layer 202. In some examples, midway between the first side S1 and the second side S2 (e.g., at a point in the X-axis direction equidistant to the first side S1 and the second side S2), the first electrode layer 202 has a fifth percentage P5 of the first conductive material and a sixth percentage P6 of the second conductive material, where the percentage P5 is approximately midway between the percentages P1 and P3 (e.g., equal to the average of P1 and P3) and the percentage P6 is approximately midway between the percentages P2 and P4. In other examples, the midway point between the first side S1 and the second side S2 may have a percentage P5 of the first conductive material that is greater than or less than the average of P1 and P3.

Figures 3A, 3B:
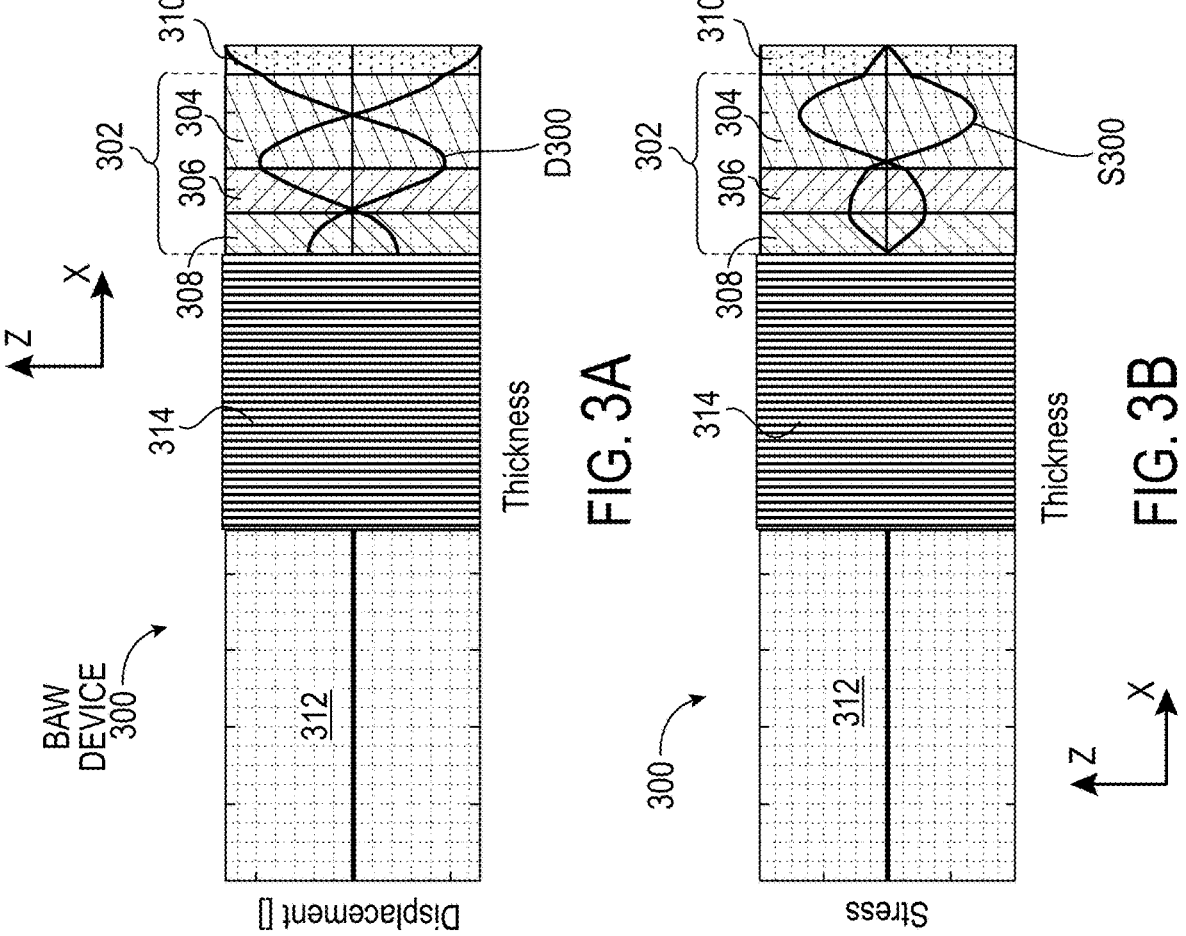
FIG. 3A is a cross-sectional side view of a first conventional BAW device with a graphical representation of displacement of a piezoelectric layer and two electrode layers superimposed thereon.
FIG. 3B is a cross-sectional side view of the BAW device of FIG. 2A with a graphical representation of stresses in the piezoelectric layer and electrode layers superimposed thereon.

FIGS. 3A and 3B are cross-sectional side views of a conventional BAW device 300 and include graphical representations of displacement and stress, respectively, at a resonant frequency of a "stack" 302. The stack 302 includes a first electrode layer 304, a piezoelectric layer 306, and a second electrode layer 308 corresponding to (approximately) a full wavelength of a frequency of acoustic resonance. The stack 302 may include additional layers not shown here. Accordingly, the BAW device 300 may be referred to as a full-wave BAW (FBAW) device.

The BAW device 300 also includes a protective layer 310. The stack 302 of the BAW 300 is isolated from a substrate 312 (e.g., silicon) by an isolation section 314. In the example of a film bulk acoustic resonator (FBAR), the isolation section 314 is an air cavity. Alternatively, the isolation section 314 may be a Bragg Mirror or similar structure to form a solidly mounted resonator (SMR).

Figures 4A, 4B:
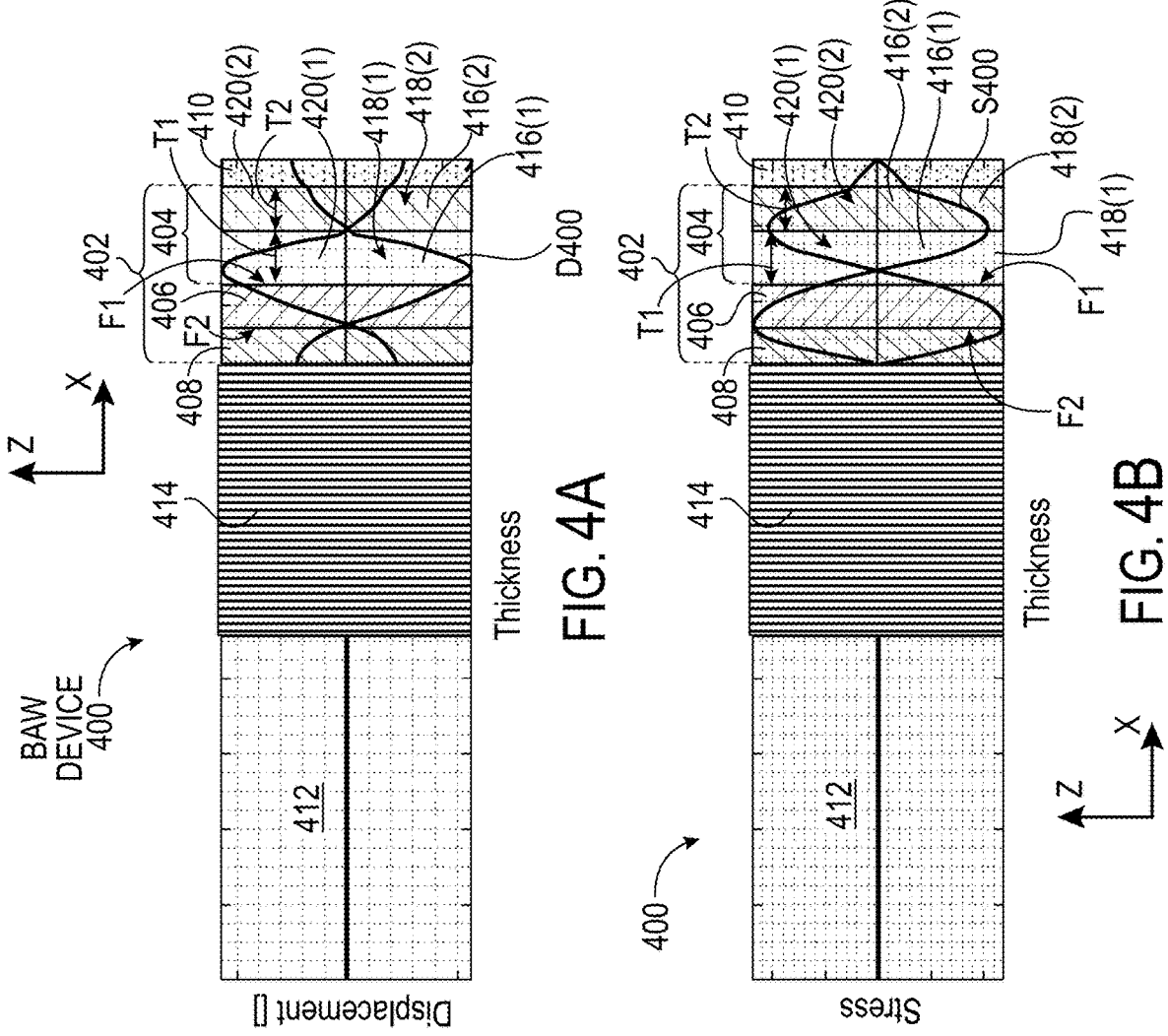
FIG. 4A is a cross-sectional side view of an exemplary BAW device with increasing acoustic impedance to improve coupling efficiency and a graphical representation of displacement of the piezoelectric layer and electrode layers superimposed thereon.
FIG. 4B is a cross-sectional side view of the BAW device of FIG. 3A with increasing acoustic impedance to improve coupling efficiency and a graphical representation of stresses in the piezoelectric layer and electrode layers superimposed thereon.

Of note in the graphical representations of displacement D300 and stress S300 in FIGS. 3A and 3B are the relative magnitudes of the waves within and outside of the piezoelectric layer 306, which are provided for comparison to the corresponding measures D400 and S400 of an exemplary BAW device 400 as shown in FIGS. 4A and 4B. The BAW device 400 includes a BAW stack 402 including a first electrode layer 404 on a first face F1 of a piezoelectric layer 406, and a second electrode layer 408 on a second face F2 of the piezoelectric layer 406. The BAW device 400 also includes a protective layer 410, a substrate 412, and an isolation section 414.

The first electrode layer 404 includes sub-layer 416(1) comprising a first material 418(1) adjacent to the face F1, and sub-layer 416(2) comprising a second material 418(2) opposite to the face F1. The first material 418(1) has a first acoustic impedance 420(1) and the second material 418(2) has a second acoustic impedance 420(2). The first acoustic impedance 420(2) of the sub-layer 416(2) is greater than the second acoustic impedance 420(1) of the sub-layer 416(1). Thus, the first electrode layer 404 has a gradient of acoustic impedance that increases in the first direction (X-axis direction) from the face F1. In contrast, the first electrode layer 304 in FIG. 3A has a constant acoustic impedance in the first direction.

To obtain a measure of improvement of the BAW device 400 compared to the BAW device 300 based only on the first electrode layer 404 having a gradient of acoustic impedance, the BAW device 400 is the same as the BAW device 300 except for the first electrode layer 404. In this regard, based on the materials 418(1)-418(2) and their respective acoustic impedances 420(1) and 420(2), the thicknesses T1 and T2 of the sub-layers 416(1)-416(2) are selected to provide an equivalent wavelength as the first electrode layer 304 in FIGS. 3A and 3B.

The displacement D400 shown in FIG. 4A, is measured at the same scale as displacement D300 in FIG. 3A. Thus, it can be easily recognized that the magnitude of displacement D400 within the piezoelectric layer 406 is greater than the magnitude of displacement D400 within the piezoelectric layer 306 in FIG. 3A. In addition, the magnitude of the displacement D400 within the piezoelectric layer 406 is significantly greater than the magnitude of displacement D400 outside of the piezoelectric layer 406 (e.g., in the sub-layer 416(2) and the protective layer 410. By comparison, the magnitude of displacement D400 in the piezoelectric layer 306 in FIG. 3A is equal to or smaller than the magnitude of displacement D400 in the first electrode layer 304 and the protective layer 310.

Figure 16:
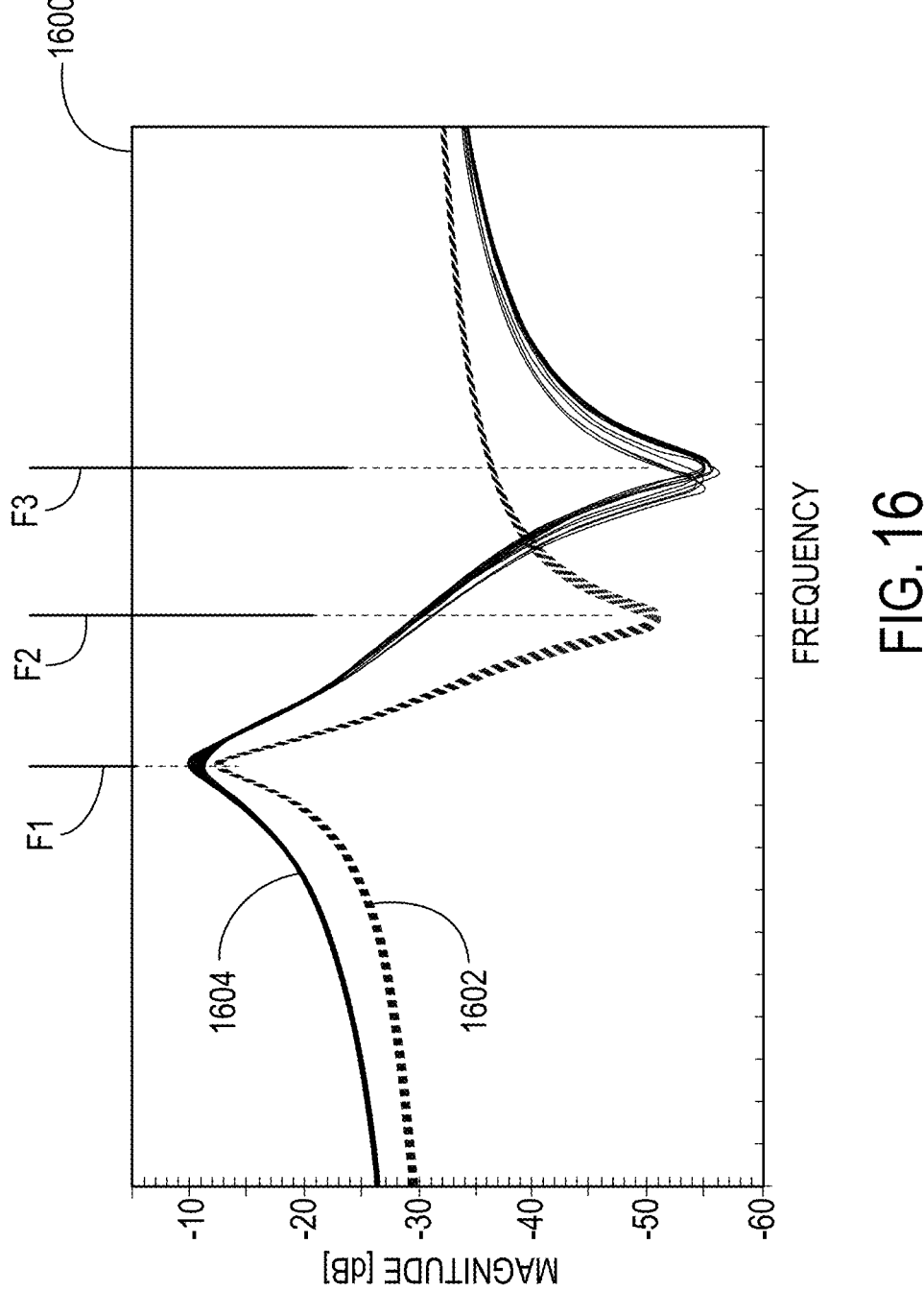
FIG. 16 is a graphical representation of resonance of a BAW device including an exemplary electrode layer including a gradient of acoustic impedance as disclosed herein and resonance of a BAW device with a conventional electrode layer, for comparison.

With regard to the stress shown in FIG. 4B, the magnitude is shown at a different scale than in FIG. 3B, but it is readily obvious that the magnitude of stress S400 inside the piezoelectric layer 406 is greater than the stress outside the piezoelectric layer 406 (e.g., within the first electrode layer 404). Whereas, in FIG. 3B, the magnitude of stress S400 inside the piezoelectric layer 306 is significantly less than the magnitude of the stress S400 outside the piezoelectric layer 306. The difference in displacement between FIG. 4A and FIG. 3A and the difference in stress S400 between FIG. 4B and FIG. 3B, clearly show that the energy of an input signal has a greater effect in the BAW device 400, indicating an increase in the coupling efficiency (k2) in the BAW device 400 due to the first electrode layer 404 having a gradient of acoustic impedance compared to the BAW device 300 with the conventional first electrode layer 304. The coupling efficiency (k2) may also be understood with reference, briefly, to the illustration 1600 in FIG. 16, which includes a graphical representation (curve) 1602 of resonance of a full-wave BAW device with a conventional electrode layer, and a representation (curve) 1604 of resonance of a full-wave BAW device including an exemplary electrode layer including a gradient of acoustic impedance as disclosed herein for comparison. In FIG. 16, the upward peaks at approximately frequency F1 indicates a frequency of resonance of both the conventional BAW device and the exemplary BAW devices as shown herein. The downward peaks at frequencies F2 and F3 indicate the frequencies of antiresonance in a BAW device comprising a conventional electrode and one having an exemplary electrode as disclosed herein, respectively.

Differences in the coupling efficiency (k2) can be seen in the illustration as follows. The curve 1604 peaks higher than the curve 1602 at frequency F1, indicating a stronger response in the exemplary BAW device than in a conventional device. Additionally, the frequency range between resonance and anti-resonance is indicative of a bandwidth of a filter employing a BAW device. Thus, as shown in FIG. 16, a device employing an exemplary electrode layer as disclosed herein would have a significantly larger (approximately double in this example) bandwidth (i.e., based on the range from frequency F1 to frequency F3) as shown in curve 1604, than a BAW device employing conventional electrodes (based on the range from frequency F1 to frequency F2) as shown in curve 1602.

Although only the first electrode layer 102 in the BAW device 100 in FIG. 1 and the first electrode layer 202 the BAW device 200 in FIG. 2 are shown to have the gradients of acoustic impedance to improve coupling capacitance, the second electrode layer 106 in the BAW device 100 and/or the second electrode layer 205 in the BAW device 200 may also be formed with materials that provide a gradient of acoustic impedance. Furthermore, while the first electrode layer 404 in FIGS. 4A and 4B having the gradient of acoustic impedance is a "top electrode" (i.e., opposite to the isolation section 414), an exemplary BAW device as disclosed herein may additionally or alternatively include a "bottom electrode" corresponding to the second electrode layer 408 (i.e., between the piezoelectric layer 406 and the isolation section 414) with a gradient of acoustic impedance to improve coupling efficiency.

Also, the BAW devices 100 and 200 in FIG. 1 have 3 sub-layers 110(1)-110(3) but the BAW device 400 in FIG. 4 has only 2 sub-layers 416(1) and 416(2). The first electrode layers 102, 404, etc., disclosed herein are not limited to having either two or three sub-layers to provide an acoustic impedance gradient and may have any desired number of sub-layers.

FIG. 5 is a flowchart of a method 500 of manufacturing an exemplary BAW device such as the BAW device 400 shown in FIGS. 4A and 4B, including a first electrode layer with a gradient of acoustic impedance increasing in a direction away from the piezoelectric layer to improve coupling efficiency, as shown in FIGS. 4A and 4B. The method 500 includes forming a piezoelectric layer 406 (block 502), forming a second electrode layer 408 on a second face F2 of the piezoelectric layer 406 (block 504), and forming a first electrode layer 404 on a first face F1 of the piezoelectric layer 406 (block 506). Forming the first electrode layer 404 comprises: disposing a first material 418(1) on a first side S1 of the first electrode layer 404 adjacent to the first face F1 of the piezoelectric layer 406 (block 508) and disposing a second material 418(2) on a second side S2 of the first electrode layer 404 opposite to the first face F1, wherein the first material 418(1) comprises a first impedance 420(1) and the second material 418(2) has a second impedance 420(2) different than the first acoustic impedance 420(1) (block 510). In this example, the second impedance 420(2) is greater than the first acoustic impedance 420(1).

FIGS. 6-9 are cross-sectional side views of exemplary BAW devices 600, 700, 800, and 900, respectively, which are additional examples that each include a first electrode layer with a gradient of acoustic impedance to improve coupling efficiency. Specifically, in each of these examples, the first electrode layers have two acoustic impedance gradients in an effort to duplicate or reinforce the benefit provided by having a first acoustic impedance gradient as shown in FIGS. 1, 2, and 4A-4B.

Figures 6, 7:
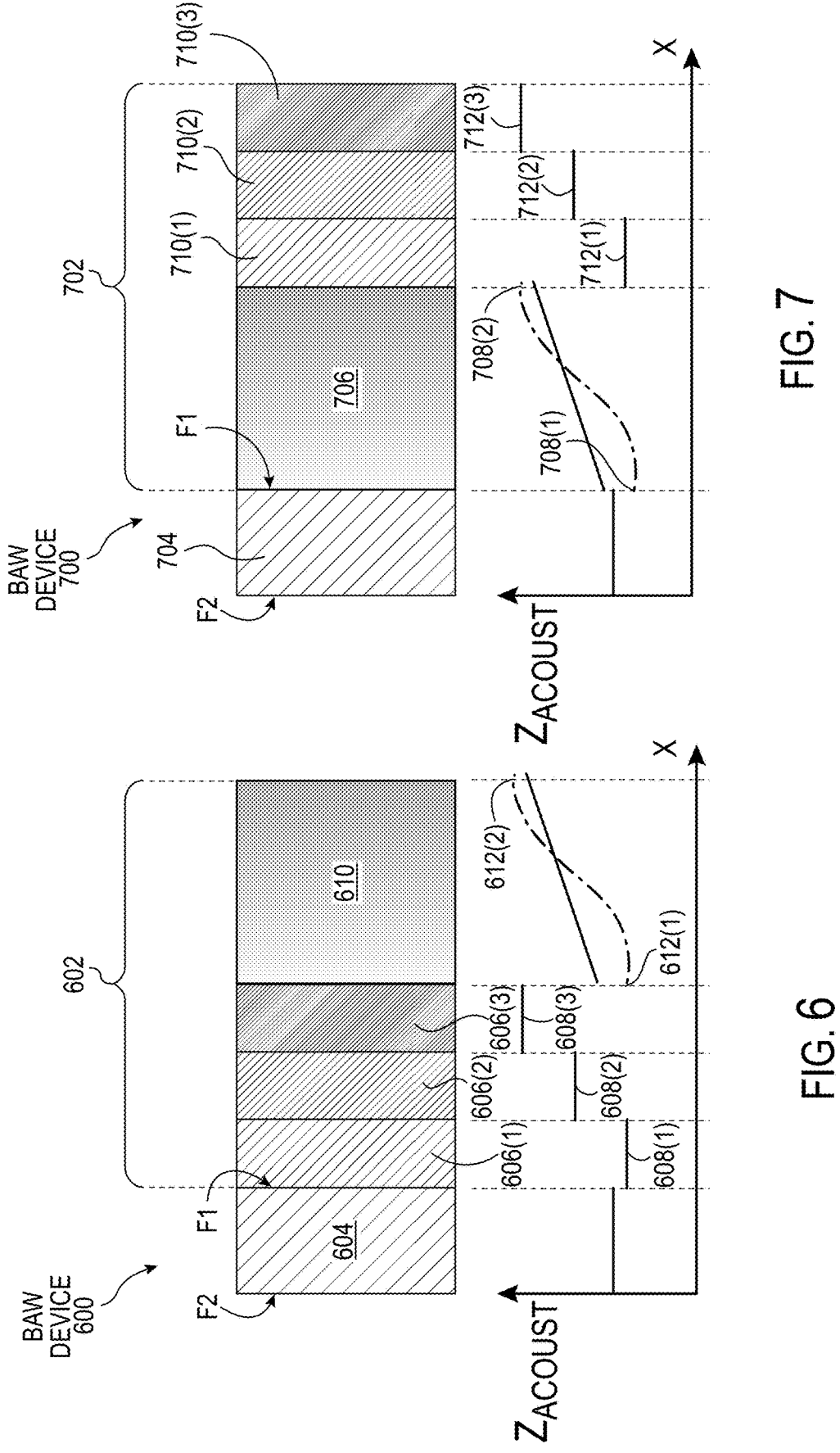
FIGS. 6 and 7 each include a cross-sectional side view of a second example of an electrode layer disposed on a piezoelectric layer, and a graph illustrating acoustic impedances of the electrode layer to improve coupling efficiency.

For example, with regard to FIG. 6, the BAW device 600 includes a first electrode layer 602 on a first face F1 of a piezoelectric layer 604. Although not shown here, it is understood that the BAW device 600 may also have a second electrode, as in FIGS. 1, 2, and 4A-4B. The first electrode layer 602 includes sub-layers 606(1)-606(3) having acoustic impedances 608(1)-608(3) that incrementally increase in the X-axis direction away from the face F1, corresponding to the sub-layers 110(1)-110(3) in FIG. 1, for example. The first electrode layer 602 also includes a sub-layer 610 having an acoustic impedance that gradually increases from an acoustic impedance 612(1) to an acoustic impedance 612(2) in the X-axis direction, corresponding to the first electrode layer 202 in FIG. 2.

As shown in the graphical representation of acoustic impedance in FIG. 6, the acoustic impedance 612(1) of the sub-layer 610 adjacent to the sub-layer 606(3) is much lower than the acoustic impedance 608(3) of the sub-layer 606(3). The acoustic impedance 612(1) may be similar to the acoustic impedance 608(1) of the sub-layer 606(1) adjacent to the piezoelectric layer 604. The sub-layer 610 having a gradient of acoustic impedance increasing gradually from 612(1) to 612(2) is added to provide further improvement to the coupling efficiency of the BAW device 600. However, such additional benefit may be reduced compared to the improvement provided by the first acoustic impedance gradient of the sub-layers 606(1)-606(3). That is, the improvement between the BAW device 300 in FIG. 3 to the BAW device 400 in FIGS. 4A and 4B (from the BAW device 400 to the BAW device 600) may not be equal to adding the sub-layer 610 to provide a second acoustic impedance gradient.

Figures 8, 9:
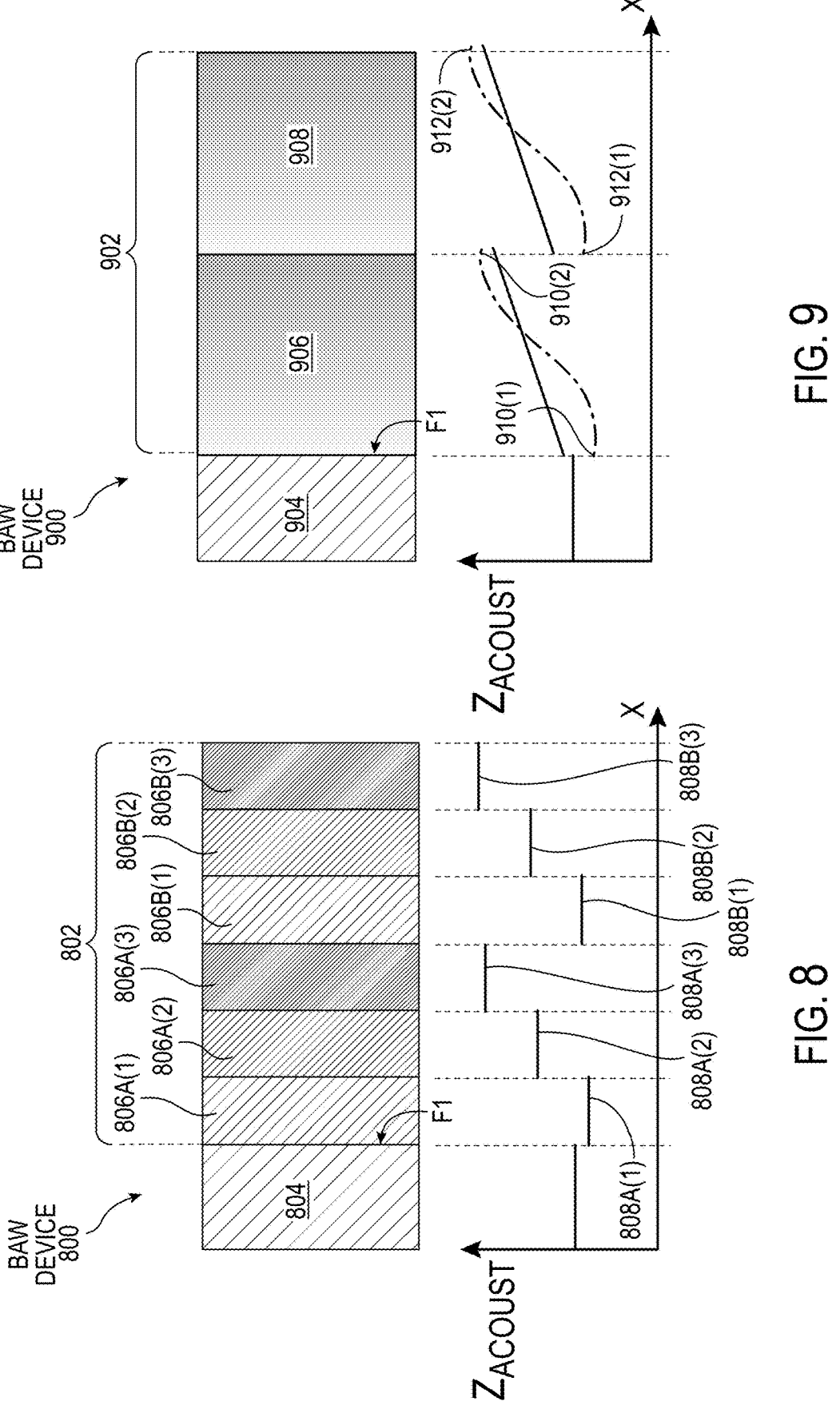
FIGS. 8 and 9 each include a cross-sectional side view of a third example of an electrode layer disposed on a piezoelectric layer, and a graph illustrating acoustic impedances of the electrode layer to improve coupling efficiency.

The BAW device 600 is a first example of providing one or more additional sub-layers for a second acoustic impedance gradient. The BAW device 600 employs a first incremental gradient and a second gradual gradient corresponding to the BAW devices 100 and 200 in FIGS. 1 and 2, respectively. FIGS. 7-9 provide the other combinations of such gradients.

Specifically, FIG. 7 is a cross-sectional side view of a BAW device 700 including a first electrode layer 702 on a first face F1 of a piezoelectric layer 704. As in FIG. 6, a second electrode layer on a second face F2 of the piezoelectric layer is not shown. The first piezoelectric layer 702 includes a first sub-layer 706 having a gradual increase form acoustic impedance 708(1) to acoustic impedance 708(2), and additional sub-layers 710(1)-710(3) with respective incrementally increasing acoustic impedances 712(1)-712(3). Essentially, the first electrode layer 702 corresponds to the first electrode layer 602 of FIG. 6 with the sub-layer 610 and the sub-layers 606(1)-606(3) reversed. That is, the first electrode layer 702 may be formed by positioning the sub-layer 610 (corresponding to the sub-layer 706) adjacent to the first face F1 between the sub-layers 606(1)-606(3) (which correspond to the sub-layers 710(1)-710(3)) and the piezoelectric layer 604.

FIG. 8 shows BAW device 800 in which a first electrode layer 802 on a first face F1 of a piezoelectric layer 804 includes sets of sub-layers 806A(1)-806A(3) and sub-layers 806B(1)-806B(3). In some examples the sub-layers 806A(1)-806A(3) may be identical to the sub-layers 806B(1)-806B(3) but the BAW device 800 is not limited in this regard. The sub-layers 806A(1)-806A(3) provide an incrementally increasing gradient of acoustic impedances 808A(1)-808A(3) which may correspond to the first electrode layer 102 in FIG. 1. The sub-layers 806B(1)-806B(3) provide a second incrementally increasing gradient of acoustic impedances 808B (1)-808B (3).

FIG. 9 shows BAW device 900 in which a first electrode layer 902 disposed on a first face F1 of a piezoelectric layer 904 includes sub-layer 906 and sub-layer 908. The first and second sub-layers 906 and 908 provide acoustic impedance gradients that gradually increase in the X-axis direction away from the face F1, like the first electrode layer 202 in FIG. 2. The first sub-layer 906 increases from an acoustic impedance 910(1) to an acoustic impedance 910(2) and the second sub-layer 908 increases from an acoustic impedance 912(1) to an acoustic impedance 912(2).

The BAW devices in FIGS. 1, 2, 4A, 4B, and 6-9 are similar with regard to having a first electrode layer with a gradient of acoustic impedance that increases in a direction away from the piezoelectric layer. This type of gradient is found to be beneficial for full-wave devices ("full-wave resonators). Thus, each of the devices in FIGS. 1, 2, 4A, 4B, and 6-9 may represent full-wave devices that may be employed in acoustic filters in RF devices, for example.

Figures 10, 11:
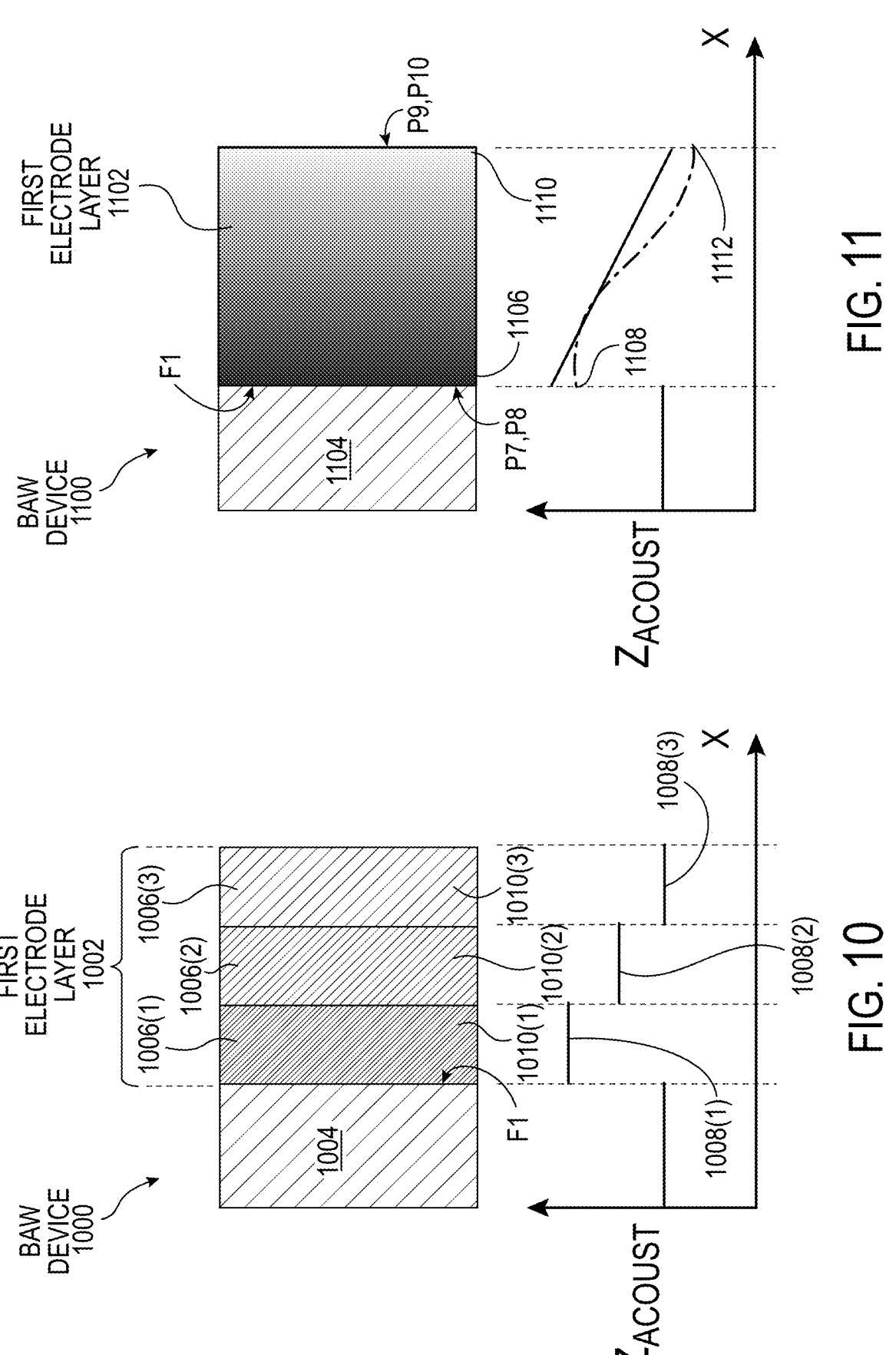
FIGS. 10 and 11 each include a cross-sectional side view of a fourth example of an electrode layer disposed on a piezoelectric layer, and a graph illustrating acoustic impedances of the electrode layer to improve coupling efficiency.

Half-wave devices are also commonly employed acoustic filter radio-frequency (RF) devices. FIG. 10 is a cross-sectional side view of a BAW device 1000 including a first electrode layer 1002 adjacent to a first face F1 of a piezoelectric layer 1004. The first electrode layer 1002 includes sub-layers 1006(1)-1006(3) having acoustic impedances 1008(1)-1008(3), respectively. In contrast to the sub-layers 110(1)-110(3) in FIG. 1, in which the materials 108(1)-108(3) were selected to provide acoustic impedances 107(1), 107(2), and 107(3) that incrementally increase in the X-axis direction away from the first face F1, the sub-layers 1006(1)-1006(3) are formed of materials 1010(1)-1010(3) such that the acoustic impedances 1008(1)-1008(3) incrementally decrease in the X-axis direction away from the first face F1. That is, the gradient of acoustic impedance in the first electrode layer 1002 is in the opposite direction of the gradient in the first electrode layer 102 in FIG. 1. An acoustic impedance decreasing away from the first face F1 of the piezoelectric layer 1004 is found to be beneficial in half-wave BAW devices.

FIG. 11 is a cross-sectional side view of a BAW device 1100 including a first electrode layer 1102 adjacent to a first face F1 of a piezoelectric layer 1104. The first electrode layer 1102 has a gradual acoustic impedance gradient, decreasing in the X-axis direction away from the first face F1. The first electrode layer 1102 may be formed in the same manner as the first electrode layer 202 described above. Formation of the first electrode layer 202 may start with deposition of a higher seventh percentage P7 (e.g., 95%-100%) of a first material 1106 having a higher acoustic impedance 1108 and a lower eighth percentage P8 (e.g., 0%-5%) of a second material 1110 having a lower acoustic impedance 1112 and gradually transition to deposition of a lower ninth percentage P9 (e.g., 0%-5%) of the first material 1106 and a higher tenth percentage P10 (95%-100%) of the second material 1110. In this way, a gradual transition of acoustic impedance from approximately the higher acoustic impedance 1108 to the lower acoustic impedance 1112 is achieved to improve coupling efficiency of the BAW device 1100.

Figures 12A, 12B:
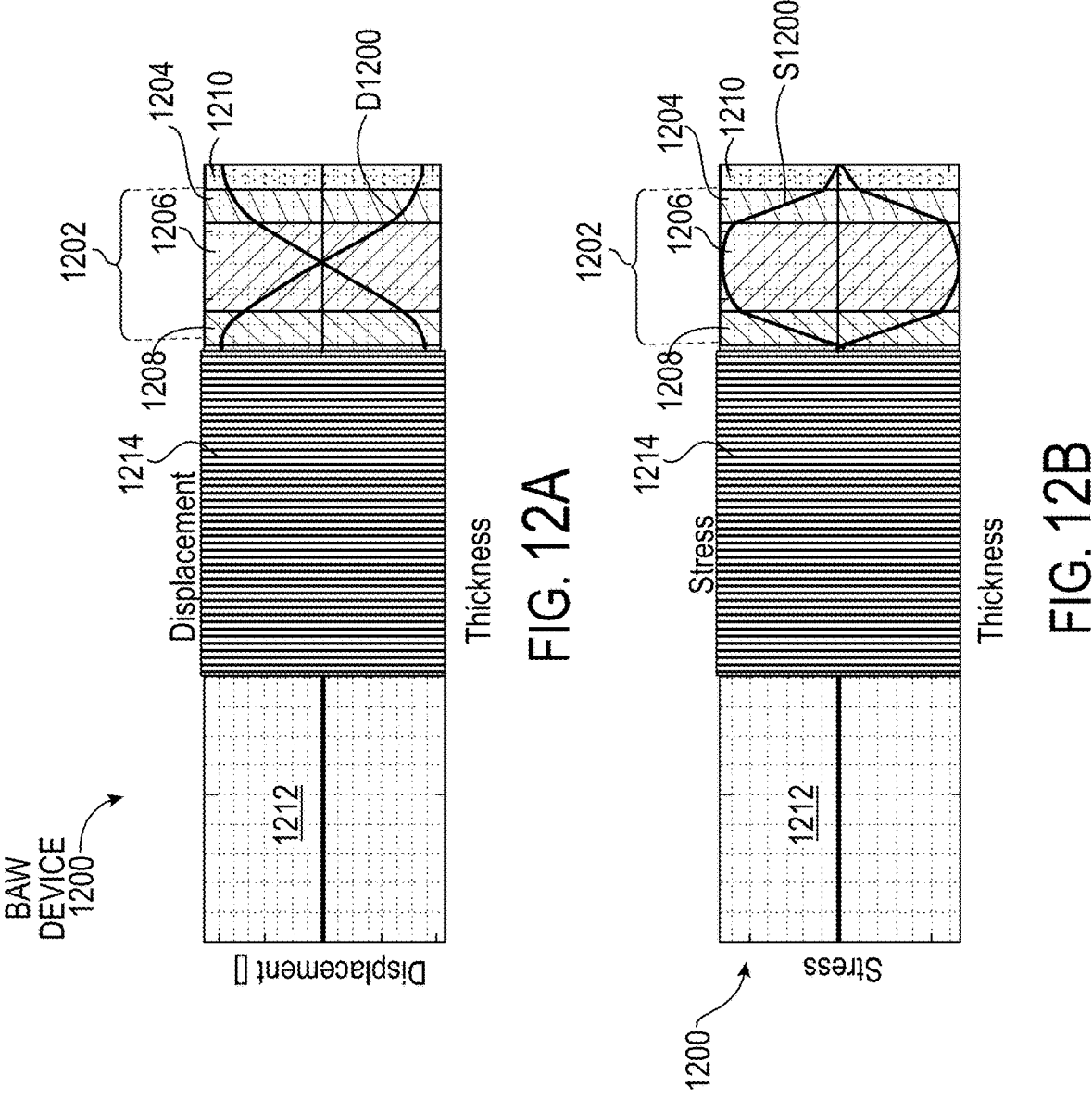
FIG. 12A is a cross-sectional side view of a second conventional BAW device with a graphical representation of displacement of a piezoelectric layer and two electrode layers superimposed thereon.
FIG. 12B is a cross-sectional side view of the BAW device of FIG. 11A with a graphical representation of stresses in the piezoelectric layer and electrode layers superimposed thereon.

FIGS. 12A and 12B are cross-sectional side views of a conventional BAW device 1200 and include graphical representations of displacement and stress, respectively, at a resonant frequency of a "stack" 1202. The stack 1202 includes a first electrode layer 1204, a piezoelectric layer 1206, and a second electrode layer 1208 corresponding to (approximately) half of a wavelength of a frequency of acoustic resonance. Accordingly, the BAW device 1200 may be referred to as a half-wave BAW device or half-wave resonator. The BAW device includes a protective layer 1210, a substrate 1212, and an isolation layer 1214 that correspond to the comparable features of the BAW device 300 in FIGS. 3A and 3B and are not explained further here.

FIGS. 12A and 12B are provided to illustrate that the "stack" 1202 including the first electrode layer 1204, the piezoelectric layer 1206, and the second electrode layer 1208 corresponds to a half wavelength of the resonant frequency of the BAW device 1200. FIGS. 12A and 12B are also provided to show displacement D1200 and stress S1200 in the stack 1202 as compared to the displacement D1300 and stress S1300 of the BAW device 1300 in FIGS. 13A and 13B. in which the first electrode layer 1204 of the BAW device 1200 has been replaced with the first electrode layer 1302 having a gradient of acoustic impedance that incrementally decreases in the X-axis direction away from the first face F1.

Figures 13A, 13B:
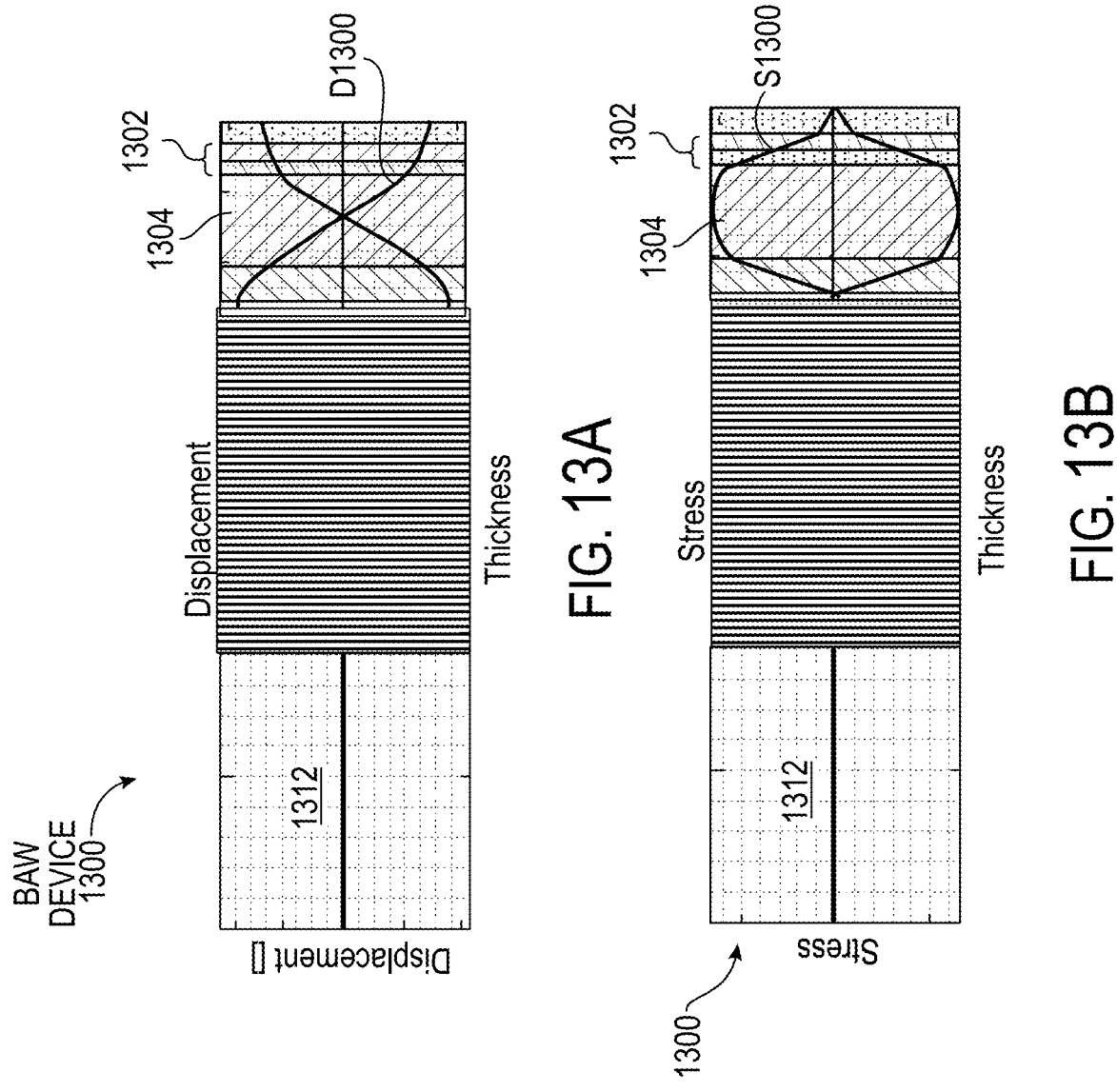
FIG. 13A is a cross-sectional side view of an exemplary solidly mounted BAW device with decreasing acoustic impedance to improve coupling efficiency and a graphical representation of displacement of the piezoelectric layer and electrode layers superimposed thereon.
FIG. 13B is a cross-sectional side view of the solidly mounted BAW device of FIG. 13A with a decreasing gradient of acoustic impedance to improve coupling efficiency and a graphical representation of stresses in the piezoelectric layer and electrode layers superimposed thereon.
Figures 14, 15:
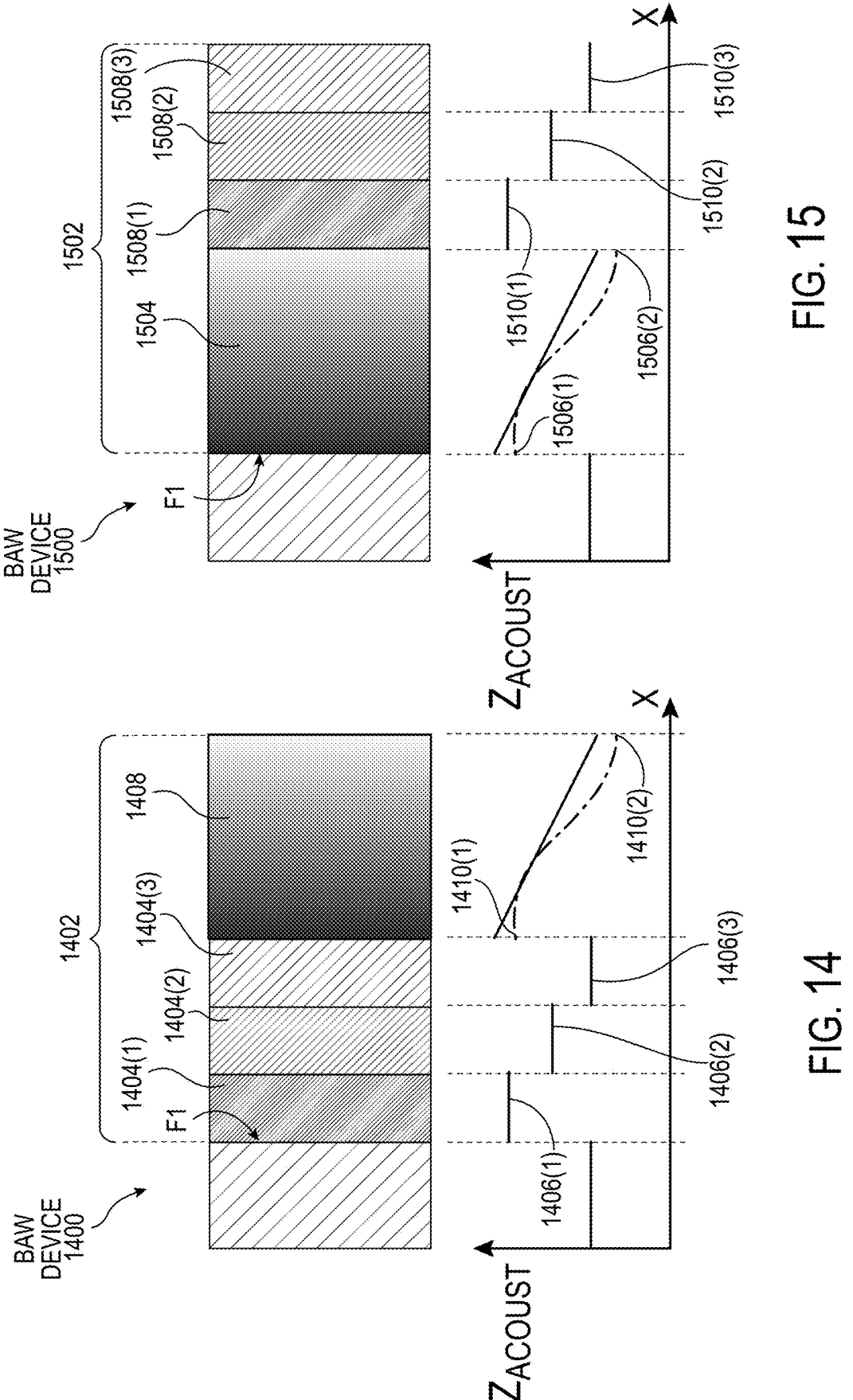
FIGS. 14 and 15 each include a cross-sectional side view of a fifth example of an electrode layer disposed on a piezoelectric layer, and a graph illustrating acoustic impedances of the electrode layer to improve coupling efficiency.

Comparing the FIG. 13A to the FIG. 12A, it can be seen, that the magnitude of displacement D1300 in the first electrode layer 1302 is reduced compared to the magnitude of displacement D1200 in the first electrode layer 1204, while the magnitudes of displacement D1200 and D1300 within the piezoelectric layers 1206 and 1304 remain approximately equal. Comparing the FIG. 13B to FIG. 12B, the stresses S1200 and S1300 within the piezoelectric layers 1206 and 1304 are approximately equal, but the stress S1300 within the first electrode layer 1302 decreases more quickly in the X-axis direction away from the face F1 than the stress S1200 within the first electrode layer 1204. Thus, it can be seen that providing a gradient of acoustic impedance within the first electrode layer 1302 that decreases in the direction away from the first face F1 improves coupling efficiency within the BAW device 1300 compared to the BAW device 1200 in FIG. 12, in which the first electrode layer 1204 has uniform acoustic impedance in the X-axis direction. FIGS. 14 and 15 are cross-sectional side views of BAW devices 1400 and 1500, respectively, each with a second gradient of acoustic impedance. In this regard, the BAW devices 1400 and 1500 correspond to the BAW devices 600 and 700 except with respect to the direction of change of acoustic impedance. That is the BAW device 1400 includes a first electrode layer 1402 including sub-layers 1404(1)-1404(3) with acoustic impedances 1406(1)-1406(3) that incrementally decrease in the X-axis direction away from a face F1 on which the first electrode layer 1402 is disposed. The first electrode layer 1402 also includes a sub-layer 1408 having a gradual gradient of decreasing acoustic impedances from a higher acoustic impedance 1410(1) to a lower acoustic impedance 1410(2) to provide a second gradient of acoustic impedance to improve coupling efficiency in a half-wave device.

The BAW device 1500 in FIG. 15 comprises a first electrode layer 1502 in which a sub-layer 1504 is disposed adjacent to the first face F1 of the piezoelectric layer to provide a gradual gradient of decreasing acoustic impedance from a higher impedance 1506(1) to a lower impedance 1506(2). The first electrode layer 1502 also includes sub-layers 1508(1)-1508(3) having acoustic impedances 1510(1)-1510(3) that incrementally decrease in the X-axis direction away from the face F1. The first electrode layer 1502 provides two gradients of acoustic impedance for further improvement over a conventional BAW device having electrode layers with uniform acoustic impedance. It should be recognized that electrode layers corresponding to the first electrode layers 1002, 1102, 1402, and 1502 in FIGS. 10, 11, 14, and 15 may be employed on either side or both sides of a piezoelectric layer to improve coupling efficiency.

According to aspects disclosed herein, the acoustic wave device with tuned resonator piezoelectric thickness may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

FIG. 16 illustrates an exemplary wireless communications device 1600 that includes radio-frequency (RF) components formed from one or more integrated circuits (ICs) 1602 and can include an exemplary BAW device including a first electrode layer having a gradient of acoustic impedance that changes in the direction away from a face of a piezoelectric layer, as shown in FIGS. 1, 2, 6-11, 14, and 15, and according to any methods of making disclosed in FIG. 5. The wireless communications device 1600 may include or be provided in any of the above-referenced devices as examples. As shown in FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RFICs, mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1600 in FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes digital-to-analog converters (DACs) 1612(1), 1612(2) for converting digital signals generated by the data processor 1606 into the I and Q analog output signals, e.g., I and Q output currents, for further processing.

Within the transmitter 1608, lowpass filters 1614(1), 1614(2) filter the I and Q analog output signals, respectively, to remove undesired signals caused by the prior digital-to-analog conversion. The lowpass filters 1614(1), 1614(2) may be implemented as BAW filter packages 1603. Amplifiers (AMPs) 1616(1), 1616(2) amplify the signals from the lowpass filters 1614(1), 1614(2), respectively, and provide I and Q baseband signals. An upconverter 1618 upconverts the I and Q baseband signals with I and Q transmit (TX) local oscillator (LO) signals from a TX LO signal generator 1622 through mixers 1620(1), 1620(2) to provide an upconverted signal 1624. A filter 1626 filters the upconverted signal 1624 to remove undesired signals caused by the frequency upconversion as well as noise in a receive frequency band. A power amplifier (PA) 1628 amplifies the upconverted signal 1624 from the filter 1626 to obtain the desired output power level and provides a transmit RF signal. The transmit RF signal is routed through a duplexer or switch 1630 and transmitted via an antenna 1632. Any of the lowpass filters 1614(1) and 1614(2), or the filter 1626, may include one or more of the BAW devices 100, 200, 400, 600-1100, and 1300-1500.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Downconversion mixers 1638(1), 1638(2) mix the output of the filter 1636 with I and Q RX LO signals (i.e., LO_I and LO_Q) from an RX LO signal generator 1640 to generate I and Q baseband signals. The I and Q baseband signals are amplified by AMPs 1642(1), 1642(2) and further filtered by lowpass filters 1644(1), 1644(2) to obtain I and Q analog input signals, which are provided to the data processor 1606. Any of the filter 1636 and the lowpass filters 1644(1), 1644(2) may include any one or more of the BAW devices 100, 200, 400, 600-1100, and 1300-1500. In this example, the data processor 1606 includes analog-to-digital converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency upconversion, while the RX LO signal generator 1640 generates the I and Q RX LO signals used for frequency downconversion. Each LO signal is a periodic signal with a particular fundamental frequency. A TX phase-locked loop (PLL) circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Wireless communications devices 1600 that can each include an exemplary BAW device manufactured according to any of the aspects described herein, e.g., in which top electrodes are disposed on an, optionally planar, surface of a piezoelectric layer that is thinned in a region to tune acoustic resonators to different frequencies, as illustrated in FIGS. 1 and 4A-4H, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 17:
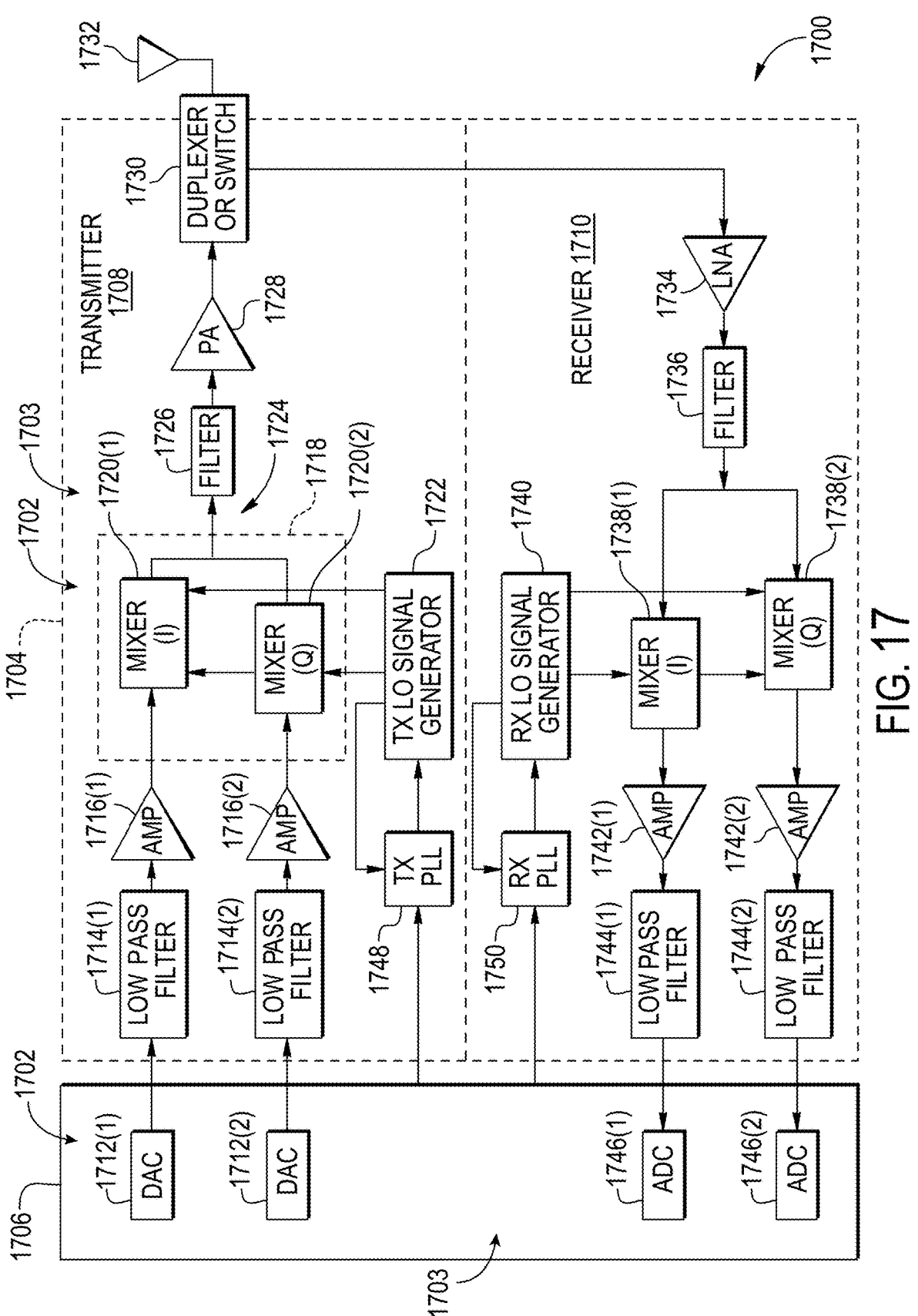
FIG. 17 is a block diagram of an exemplary wireless communications device that includes a sandwich electrode for higher resonant frequency, including but not limited to the BAW devices in FIG. 1.
Figure 18:
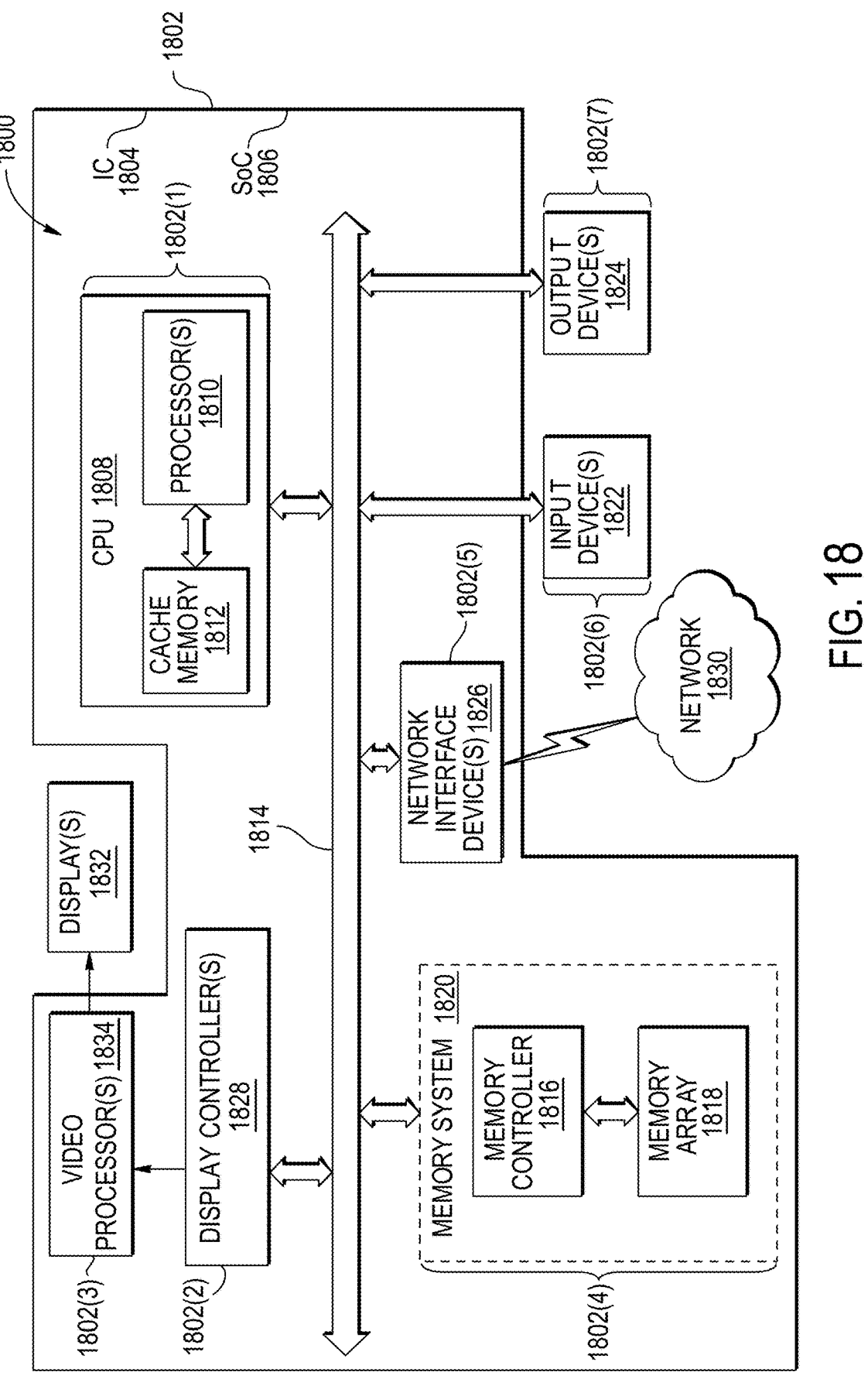
FIG. 18 is a block diagram of an exemplary processor-based system that can include the BAW device that includes a sandwich electrode for higher resonant frequency, including but not limited to the BAW devices in FIG. 1.

FIG. 17 illustrates an example of a processor-based system 1700 including circuits including an exemplary BAW device including a first electrode layer has a gradient of acoustic impedance that changes in the direction away from a face of a piezoelectric layer, as shown in FIGS. 1, 2, 6-11, 14, and 15, and according to any methods of making disclosed in FIG. 5. In this example, the processor-based system 1700 includes one or more central processor units (CPUs) 1702, which may also be referred to as CPU or processor cores, each including one or more processors 1704. The CPU(s) 1702 may have cache memory 1706 coupled to the processor(s) 1704 for rapid access to temporarily stored data. The CPU(s) 1702 is coupled to a system bus 1708 and can intercouple master and slave devices included in the processor-based system 1700. As is well known, the CPU(s) 1702 communicates with these other devices by exchanging address, control, and data information over the system bus 1708. For example, the CPU(s) 1702 can communicate bus transaction requests to a memory controller 1710 as an example of a slave device. Although not illustrated in FIG. 17, multiple system buses 1708 could be provided; wherein each system bus 1708 constitutes a different fabric.

Other master and slave devices can be connected to the system bus 1708. As illustrated in FIG. 17, these devices can include a memory system 1712 that includes the memory controller 1710 and one or more memory arrays 1714, one or more input devices 1716, one or more output devices 1718, one or more network interface devices 1720, and one or more display controllers 1722, as examples. The input device(s) 1716 can include any type of input device, including, but not limited to, input keys, switches, voice processors, etc. The output device(s) 1718 can include any type of output device, including, but not limited to, audio, video, other visual indicators, etc. The network interface device(s) 1720 can be any device configured to allow an exchange of data to and from a network 1724. The network 1724 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1720 can be configured to support any type of communications protocol desired.

The CPU(s) 1702 may also be configured to access the display controller(s) 1722 over the system bus 1708 to control information sent to one or more displays 1726. The display controller(s) 1722 sends information to the display(s) 1726 to be displayed via one or more video processors 1728, which process the information to be displayed into a format suitable for the display(s) 1726. The display(s) 1726 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or another computer-readable medium and executed by a processor or other processing device, or combinations of both. As examples, the master and slave devices described herein may be employed in any circuit, hardware component, IC, or IC chip. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in several different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A bulk acoustic wave (BAW) device, comprising:
a piezoelectric layer;
a first electrode layer on a first face of the piezoelectric layer; and
a second electrode layer on a second face of the piezoelectric layer,
wherein:
the first electrode layer comprises:
a first side comprising a first material adjacent to the first face of the piezoelectric layer; and
a second side comprising a second material opposite to the first face of the piezoelectric layer;
the first material comprises a first acoustic impedance; and
the second material comprises a second acoustic impedance different than the first acoustic impedance.

2. The BAW device of clause 1, wherein the second acoustic impedance is greater than the first acoustic impedance.

3. The BAW device of clause 1, wherein the first acoustic impedance is greater than the second acoustic impedance.

4. The BAW device of any of clause 1 to clause 3, wherein:

the first material comprises a first conductive material; and the second material comprises a second conductive material.

5. The BAW device of clause 4, wherein:

the first conductive material is in direct contact with the second conductive material.

6. The BAW device of any of clause 1 to clause 4, wherein the first electrode layer further comprises a third material between the first material and the second material, wherein the third material comprises a third acoustic impedance between the first acoustic impedance and the second acoustic impedance.

7. The BAW device of clause 6, wherein:

the first material comprises a first conductive material;

the second material comprises a second conductive material; and the third material comprises a third conductive material different than the first conductive material and the second conductive material.

8. The BAW device of clause 7, wherein the third conductive material is in direct contact with the first conductive material and the second conductive material.

9. The BAW device of any of clause 1 to clause 5, wherein the first electrode layer further comprises:

a first sub-layer comprising a layer of the first material disposed on the piezoelectric layer;

a second sub-layer comprising a layer of the second material disposed on the first sub-layer; and a third sub-layer comprising a layer of a third material disposed on the second sub-layer.

10. The BAW device of clause 9, wherein:

the first material comprises a first conductive material;

the second material comprises a second conductive material; and the third material comprises the first conductive material and the second conductive material.

11. The BAW device of any of clause 4 to clause 5, wherein:

the first material comprises less than five percent (5%) of the second conductive material; and the second material comprises less than five percent (5%) of the first conductive material.

12. The BAW device of any of clause 1 to clause 5, wherein:

the first material comprises a first percentage of a first conductive material and a second percentage of a second conductive material;

the second material comprises a third percentage of the first conductive material and a fourth percentage of the second conductive material; and the first percentage is different than the third percentage.

13. The BAW device of clause 12, wherein:

between the first side and the second side, the first electrode layer comprises a fifth percentage of the first conductive material and a sixth percentage of the second conductive material; and the fifth percentage is between the first percentage and the third percentage.

14. The BAW device of any of clause 1 to clause 3, wherein from the first side to the second side of the first electrode layer, an acoustic impedance of the first electrode layer changes continuously from the first acoustic impedance to the second acoustic impedance.

15. The BAW device of any of clause 1 to clause 3, wherein from the first side to the second side of the first electrode layer, an acoustic impedance of the first electrode layer comprises at least one discontinuous change.

16. The BAW device of any of clause 1 to clause 3, wherein the first electrode layer comprises a first layer and a second layer, wherein:

the first layer is between the second layer and the piezoelectric layer;

the first layer comprises:

the first material on the first side adjacent to the first face of the piezoelectric layer; and the second material disposed on the first material; and the second layer comprises:

the first material disposed on the second material of the first layer; and the second material on the second side.

17. The BAW device of clause 16, wherein:

the first layer further comprises:

a third material between the first material and the second material of the first layer; and the second layer further comprises:

the third material between the first material and the second material of the second layer.

18. The BAW device of clause 16, wherein in the first layer and the second layer:

the first material comprises more than ninety-five percent (95%) of a first conductive material and less than five percent (5%) of a second conductive material; and the second material comprises more than ninety-five percent (95%) of the second conductive material and less than five percent (5%) of the first conductive material.

19. The BAW device of clause 16, wherein:

an acoustic impedance of the first layer comprises at least one discontinuous change; and an acoustic impedance of the second layer changes continuously.

20. The BAW device of clause 16, wherein:

an acoustic impedance of the first layer changes continuously; and an acoustic impedance of the second layer comprises at least one discontinuous change.

21. The BAW device of any of clause 1 to clause 20, wherein the second electrode layer comprises:

a third side comprising a fourth material adjacent to the second face of the piezoelectric layer; and a fourth side comprising a fifth material opposite to the second face of the piezoelectric layer.

22. The BAW device of any of clause 1 to clause 21 integrated into a semiconductor die.

23. The BAW device of any of clause 1 to clause 22 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

24. A method of making a bulk acoustic wave (BAW) device, the method comprising:
  forming a piezoelectric layer;
  forming a second electrode layer on a second face of the piezoelectric layer; and
  forming a first electrode layer on a first face of the piezoelectric layer,
  wherein:
    the first electrode layer comprises:
      a first material on a first side of the first electrode layer adjacent to the first face of the piezoelectric layer; and
      a second material on a second side of the first electrode layer opposite to the first face of the piezoelectric layer;
    the first material comprises a first acoustic impedance; and
    the second material comprises a second acoustic impedance different than the first acoustic impedance.

25. An acoustic filter comprising:
  a bulk acoustic wave (BAW) device, comprising:
    a piezoelectric layer;
    a first electrode layer on a first face of the piezoelectric layer; and
    a second electrode layer on a second face of the piezoelectric layer,
    wherein:
      the first electrode layer comprises:
        a first side comprising a first material adjacent to the first face of the piezoelectric layer, and
        a second side comprising a second material opposite to the first face of the piezoelectric layer;
      the first material comprises a first acoustic impedance; and
      the second material comprises a second acoustic impedance different than the first acoustic impedance.

What is claimed is:

1. A bulk acoustic wave (BAW) device, comprising:
  a piezoelectric layer;
  a first electrode layer on a first face of the piezoelectric layer; and
  a second electrode layer on a second face of the piezoelectric layer,
  wherein:
    the first electrode layer comprises:
      a first side comprising a first material adjacent to the first face of the piezoelectric layer; and
      a second side comprising a second material opposite to the first face of the piezoelectric layer;
    the first material comprises a first acoustic impedance;
    the second material comprises a second acoustic impedance different than the first acoustic impedance; and
    from the first side to the second side of the first electrode layer, an acoustic impedance of the first electrode layer changes continuously from the first acoustic impedance to the second acoustic impedance.

2. The BAW device of claim 1, wherein the second electrode layer comprises the first material, the second material, and a third material between the first material and the second material, wherein the third material comprises a third acoustic impedance between the first acoustic impedance and the second acoustic impedance.

3. The BAW device of claim 2, wherein:
  the first material comprises a first conductive material;
  the second material comprises a second conductive material; and
  the third material comprises a third conductive material different than the first conductive material and the second conductive material.

4. The BAW device of claim 3, wherein the third conductive material is in direct contact with the first conductive material and the second conductive material.

5. The BAW device of claim 1, wherein:
  the first material comprises a first conductive material; and
  the second material comprises a second conductive material.

6. The BAW device of claim 5, wherein:
  the first conductive material is in direct contact with the second conductive material.

7. The BAW device of claim 5, wherein:
  the first material comprises less than five percent (5%) of the second conductive material; and
  the second material comprises less than five percent (5%) of the first conductive material.

8. The BAW device of claim 1, wherein the second electrode layer comprises a first layer and a second layer, wherein:
  the first layer is between the second layer and the piezoelectric layer;
  the first layer comprises:
    the first material on a first side of the second electrode layer adjacent to the second face of the piezoelectric layer; and
    the second material disposed on the first material; and
  the second layer comprises:
    the first material disposed on the second material of the first layer; and
    the second material on a second side of the second electrode layer.

9. The BAW device of claim 8, wherein:
  the first layer further comprises:
    a third material between the first material and the second material of the first layer; and
  the second layer further comprises:
    the third material between the first material and the second material of the second layer.

10. The BAW device of claim 8, wherein in the first layer and the second layer:
  the first material comprises more than ninety-five percent (95%) of a first conductive material and less than five percent (5%) of a second conductive material; and
  the second material comprises more than ninety-five percent (95%) of the second conductive material and less than five percent (5%) of the first conductive material.

11. The BAW device of claim 1, wherein the second electrode layer comprises:
  a first sub-layer comprising a layer of the first material disposed on the piezoelectric layer;
  a second sub-layer comprising a layer of the second material disposed on the first sub-layer; and a third sub-layer comprising a layer of a third material disposed on the second sub-layer.

12. The BAW device of claim 11, wherein:

the first material comprises a first conductive material;

the second material comprises a second conductive material; and the third material comprises the first conductive material and the second conductive material.

13. The BAW device of claim 1, wherein:

the first material comprises a first percentage of a first conductive material and a second percentage of a second conductive material;

the second material comprises a third percentage of the first conductive material and a fourth percentage of the second conductive material; and the first percentage is different than the third percentage.

14. The BAW device of claim 13, wherein:

between the first side and the second side, the first electrode layer comprises a fifth percentage of the first conductive material and a sixth percentage of the second conductive material; and the fifth percentage is between the first percentage and the third percentage.

15. The BAW device of claim 1, wherein the second acoustic impedance is greater than the first acoustic impedance.

16. The BAW device of claim 1, wherein the first acoustic impedance is greater than the second acoustic impedance.

17. The BAW device of claim 1, wherein from a first side to a second side of the second electrode layer, an acoustic impedance of the second electrode layer comprises at least one discontinuous change.

18. The BAW device of claim 1, wherein the second electrode layer comprises:

a third side comprising a fourth material adjacent to the second face of the piezoelectric layer; and a fourth side comprising a fifth material opposite to the second face of the piezoelectric layer.

19. The BAW device of claim 1 integrated into a semiconductor die.

20. The BAW device of claim 1 integrated into a device selected from the group consisting of: a set-top box; an entertainment unit; a navigation device; a communications device; a fixed location data unit; a mobile location data unit; a global positioning system (GPS) device; a mobile phone; a cellular phone; a smartphone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

21. The BAW device of claim 1, wherein an acoustic impedance of the second electrode layer comprises at least one discontinuous change.

22. The BAW device of claim 1, wherein an acoustic impedance of the second electrode layer changes continuously from a first side of the second electrode layer to a second side of the second electrode layer.

23. A bulk acoustic wave (BAW) device, comprising:

a piezoelectric layer;

a first electrode layer on a first face of the piezoelectric layer; and a second electrode layer on a second face of the piezoelectric layer, wherein:

the first electrode layer comprises:

a first side comprising a first material adjacent to the first face of the piezoelectric layer; and a second side comprising a second material opposite to the first face of the piezoelectric layer;

the first material comprises a first acoustic impedance;

the second material comprises a second acoustic impedance different than the first acoustic impedance;

the first electrode layer comprises a first layer and a second layer;

the first layer is between the second layer and the piezoelectric layer;

the first layer comprises:

the first material on the first side adjacent to the first face of the piezoelectric layer; and the second material disposed on the first material;

the second layer comprises:

the first material disposed on the second material of the first layer; and the second material on the second side;

an acoustic impedance of the first layer comprises at least one discontinuous change; and an acoustic impedance of the second layer changes continuously.

24. A bulk acoustic wave (BAW) device, comprising:

a piezoelectric layer;

a first electrode layer on a first face of the piezoelectric layer; and a second electrode layer on a second face of the piezoelectric layer, wherein:

the first electrode layer comprises:

a first side comprising a first material adjacent to the first face of the piezoelectric layer; and a second side comprising a second material opposite to the first face of the piezoelectric layer;

the first material comprises a first acoustic impedance;

the second material comprises a second acoustic impedance different than the first acoustic impedance;

the first electrode layer comprises a first layer and a second layer;

the first layer is between the second layer and the piezoelectric layer;

the first layer comprises:

the first material on the first side adjacent to the first face of the piezoelectric layer; and the second material disposed on the first material;

the second layer comprises:

the first material disposed on the second material of the first layer; and the second material on the second side;

an acoustic impedance of the first layer changes continuously; and an acoustic impedance of the second layer comprises at least one discontinuous change.

25. A method of making a bulk acoustic wave (BAW) device, the method comprising:

forming a piezoelectric layer;

forming a second electrode layer on a second face of the piezoelectric layer; and forming a first electrode layer on a first face of the piezoelectric layer, wherein:

the first electrode layer comprises:

a first material on a first side of the first electrode layer adjacent to the first face of the piezoelectric layer; and a second material on a second side of the first electrode layer opposite to the first face of the piezoelectric layer;

the first material comprises a first acoustic impedance;

the second material comprises a second acoustic impedance different than the first acoustic impedance; and from the first side to the second side of the first electrode layer, an acoustic impedance of the first electrode layer changes continuously from the first acoustic impedance to the second acoustic impedance.

* * * * *